US012168713B2

(12) United States Patent
Ellson et al.

(10) Patent No.: US 12,168,713 B2
(45) Date of Patent: Dec. 17, 2024

(54) MATERIALS FOR PHOTOINITIATED CATIONIC RING-OPENING POLYMERIZATION AND USES THEREOF

(71) Applicant: Inkbit, LLC, Medford, MA (US)

(72) Inventors: Gregory Ellson, Cambridge, MA (US); Scott Twiddy, Somerville, MA (US)

(73) Assignee: Inkbit, LLC, Medford, MA (US)

( * ) Notice: Subject to any disclaimer, the term of this patent is extended or adjusted under 35 U.S.C. 154(b) by 0 days.

(21) Appl. No.: 17/563,196

(22) Filed: Dec. 28, 2021

(65) Prior Publication Data

US 2022/0119587 A1 Apr. 21, 2022

Related U.S. Application Data

(63) Continuation of application No. PCT/US2021/036777, filed on Jun. 10, 2021.

(60) Provisional application No. 63/037,226, filed on Jun. 10, 2020.

(51) Int. Cl.
| | |
|---|---|
| *C08G 59/68* | (2006.01) |
| *B29C 64/112* | (2017.01) |
| *B33Y 10/00* | (2015.01) |
| *B33Y 70/00* | (2020.01) |
| *C08G 59/02* | (2006.01) |
| *C08G 59/22* | (2006.01) |
| *C08G 59/24* | (2006.01) |
| *C08G 59/62* | (2006.01) |
| *C08G 63/06* | (2006.01) |
| *C08K 5/06* | (2006.01) |
| *C08L 63/00* | (2006.01) |
| *B29K 63/00* | (2006.01) |

(52) U.S. Cl.
CPC .......... *C08G 59/022* (2013.01); *B29C 64/112* (2017.08); *B33Y 10/00* (2014.12); *B33Y 70/00* (2014.12); *C08G 59/223* (2013.01); *C08G 59/24* (2013.01); *C08G 59/68* (2013.01); *C08G 63/06* (2013.01); *C08K 5/06* (2013.01); *B29K 2063/00* (2013.01)

(58) Field of Classification Search
None
See application file for complete search history.

(56) References Cited

U.S. PATENT DOCUMENTS

| | | | |
|---|---|---|---|
| 3,931,287 A | 1/1976 | Kehr et al. | |
| 4,624,912 A * | 11/1986 | Zweifel | G03F 7/0385 522/15 |
| 5,270,368 A | 12/1993 | Lent et al. | |
| 5,287,435 A | 2/1994 | Cohen et al. | |
| 5,303,141 A | 4/1994 | Batchelder et al. | |
| 5,340,433 A | 8/1994 | Crump | |
| 5,516,813 A * | 5/1996 | Starkey | C08G 59/68 522/170 |
| 5,614,289 A * | 3/1997 | Kobayashi | G06K 19/02 428/319.3 |
| 5,866,058 A | 2/1999 | Batchelder et al. | |
| 5,889,084 A | 3/1999 | Roth | |
| 5,900,207 A | 5/1999 | Danforth et al. | |
| 5,939,008 A | 8/1999 | Comb et al. | |
| 5,968,561 A | 10/1999 | Batchelder et al. | |
| 6,004,124 A | 12/1999 | Swanson et al. | |
| 6,022,207 A | 2/2000 | Dahlin et al. | |
| 6,492,651 B2 | 12/2002 | Kerekes | |
| 6,578,596 B1 | 6/2003 | Batchelder et al. | |
| 6,645,412 B2 | 11/2003 | Priedman, Jr. | |
| 7,125,512 B2 | 10/2006 | Crump et al. | |
| 7,183,335 B2 | 2/2007 | Napadensky | |
| 7,198,826 B2 | 4/2007 | Gardner et al. | |
| 7,300,619 B2 | 11/2007 | Napadensky et al. | |
| 7,314,591 B2 | 1/2008 | Priedman, Jr. | |
| 7,479,510 B2 | 1/2009 | Napadensky et al. | |
| 7,502,023 B2 | 3/2009 | Zinniel et al. | |
| 7,534,386 B2 | 5/2009 | Priedman, Jr. | |
| 7,851,122 B2 | 12/2010 | Napadensky | |
| 7,910,041 B1 | 3/2011 | Priedman, Jr. | |
| 8,106,107 B2 | 1/2012 | Napadensky | |
| 8,123,999 B2 | 2/2012 | Priedman, Jr. | |
| 8,178,479 B2 | 5/2012 | Cernohous | |
| 8,334,025 B2 | 12/2012 | Fong et al. | |
| 8,481,241 B2 | 7/2013 | Napadensky et al. | |
| 8,512,024 B2 | 8/2013 | Pax | |
| 8,574,485 B2 | 11/2013 | Kramer et al. | |
| 8,718,522 B2 | 5/2014 | Chillscyzn et al. | |
| 8,846,777 B2 | 9/2014 | Bowman et al. | |
| 8,883,392 B2 | 11/2014 | Napadensky et al. | |
| 8,932,511 B2 | 1/2015 | Napadensky | |
| 9,023,566 B2 | 5/2015 | Martin | |
| 9,144,940 B2 | 9/2015 | Martin | |

(Continued)

FOREIGN PATENT DOCUMENTS

| | | | | |
|---|---|---|---|---|
| CN | 102193314 A * | 9/2011 | ........... | C07D 209/82 |
| EP | 1434683 B1 | 7/2006 | | |

(Continued)

OTHER PUBLICATIONS

Registry data for 2386-87-0, provided by STN (no date).*
Registry data for 178233-72-2, provided by CAS Common Chemistry (no date).*
Product data sheet for Chivacure® 1176, provided by Chitec. (Year: 2005).*
Machine translation of CN-102193314-A (no date).*
U.S. Appl. No. 63/330,736, filed Apr. 13, 2022 (Filing Date), Nelson et al.
U.S. Appl. No. 63/330,738, filed Apr. 13, 2022 (Filing Date), Nelson et al.
International Search Report and Written Opinion, mailed Dec. 22, 2021, for PCT Application No. PCT/US2021/051932 (11 pages).

(Continued)

*Primary Examiner* — Michael J Feely
(74) *Attorney, Agent, or Firm* — COOLEY LLP; Heidi A. Erlacher; Sam Scowcroft Matthews

(57) ABSTRACT

The present disclosure relates to materials for photoinitiated cationic ring-opening polymerization (ROP). The present disclosure also relates to uses of the materials, e.g., in 3D printing.

31 Claims, 2 Drawing Sheets

(56) References Cited

U.S. PATENT DOCUMENTS

| | | |
|---|---|---|
| 9,168,699 B2 | 10/2015 | Pax |
| 9,233,504 B2 | 1/2016 | Douglas et al. |
| 9,248,611 B2 | 2/2016 | Divine et al. |
| 9,334,402 B2 | 5/2016 | Napadensky |
| 9,347,185 B2 | 5/2016 | Reda |
| 9,399,322 B2 | 7/2016 | Mulliken |
| 9,404,200 B2 | 8/2016 | Steiner et al. |
| 9,418,424 B2 | 8/2016 | Goodman et al. |
| 9,441,084 B2 | 9/2016 | Heardon |
| 9,475,233 B2 | 10/2016 | Schmehl |
| 9,482,974 B2 | 11/2016 | Martin |
| 9,523,934 B2 | 12/2016 | Orrock et al. |
| 9,527,242 B2 | 12/2016 | Rodgers et al. |
| 9,527,247 B2 | 12/2016 | Dikovsky et al. |
| 9,545,756 B2 | 1/2017 | Sadusk et al. |
| 9,546,270 B2 | 1/2017 | Hirsch et al. |
| 9,557,661 B2 | 1/2017 | Martin |
| 9,708,442 B1 | 7/2017 | Kwisnek et al. |
| 9,744,722 B2 | 8/2017 | Rodgers |
| 9,785,064 B2 | 10/2017 | Orrock et al. |
| 9,864,274 B2 | 1/2018 | Rundlett et al. |
| 9,868,255 B2 | 1/2018 | Comb et al. |
| 9,878,495 B2 | 1/2018 | Douglas et al. |
| 9,884,450 B2 | 2/2018 | Schmehl |
| 9,933,718 B2 | 4/2018 | Martin |
| 9,963,836 B1 | 5/2018 | Brenner et al. |
| 10,005,227 B2 | 6/2018 | Facci et al. |
| 10,005,236 B2 | 6/2018 | Ber et al. |
| 10,022,889 B2 | 7/2018 | Demuth et al. |
| 10,022,917 B2 | 7/2018 | Pax |
| 10,023,500 B2 | 7/2018 | O' Brien et al. |
| 10,023,739 B2 | 7/2018 | Rodgers et al. |
| 10,059,031 B1 | 8/2018 | Demuth et al. |
| 10,059,053 B2 | 8/2018 | Jaker et al. |
| 10,093,061 B2 | 10/2018 | Douglas et al. |
| 10,113,064 B2 | 10/2018 | Hirsch et al. |
| 10,144,828 B2 | 12/2018 | Rodgers et al. |
| 10,189,210 B2 | 1/2019 | Rodgers et al. |
| 10,201,929 B2 | 2/2019 | Sadusk et al. |
| 10,221,284 B2 | 3/2019 | Eckel |
| 10,252,466 B2 | 4/2019 | Ramos et al. |
| 10,259,210 B2 | 4/2019 | Vidavsky et al. |
| 10,272,592 B2 | 4/2019 | Demuth et al. |
| 10,315,358 B2 | 6/2019 | Sadusk et al. |
| 10,335,994 B2 | 7/2019 | Napadensky et al. |
| 10,350,833 B1 | 7/2019 | Zaneveld |
| 10,400,057 B2 | 9/2019 | Kwisnek et al. |
| 10,456,984 B2 | 10/2019 | MatUS ik et al. |
| 10,457,833 B2 | 10/2019 | Granlund et al. |
| 10,557,056 B2 | 2/2020 | Sweeney et al. |
| 10,569,470 B2 | 2/2020 | Donovan et al. |
| 10,589,511 B2 | 3/2020 | Vidavsky et al. |
| 10,661,514 B2 | 5/2020 | Talgorn et al. |
| 10,675,853 B2 | 6/2020 | Pawloski et al. |
| 10,769,324 B2 | 9/2020 | Matusik et al. |
| 10,864,659 B1 | 12/2020 | Zaneveld et al. |
| 10,926,473 B1 | 2/2021 | Matusik et al. |
| 10,974,460 B2 | 4/2021 | Chen et al. |
| 11,065,782 B2 | 7/2021 | Gardiner et al. |
| 11,173,667 B2 | 11/2021 | Wang et al. |
| 11,207,836 B2 | 12/2021 | Ramos et al. |
| 11,384,250 B2 | 7/2022 | Moussa |
| 11,534,959 B2 | 12/2022 | Twiddy et al. |
| 11,926,103 B2 | 3/2024 | Wang et al. |
| 2002/0017743 A1 | 2/2002 | Priedman, Jr. |
| 2002/0086161 A1* | 7/2002 | Smetana .............. C08F 283/10 |
| | | 428/522 |
| 2002/0104973 A1 | 8/2002 | Kerekes |
| 2003/0004600 A1 | 1/2003 | Priedman, Jr. |
| 2003/0083771 A1 | 5/2003 | Schmidt |
| 2003/0092820 A1 | 5/2003 | Schmidt et al. |
| 2003/0207959 A1 | 11/2003 | Napadensky et al. |
| 2003/0209836 A1 | 11/2003 | Sherwood |
| 2005/0023719 A1 | 2/2005 | Nielsen et al. |
| 2005/0093208 A1 | 5/2005 | Boyd et al. |
| 2005/0173838 A1 | 8/2005 | Priedman, Jr. et al. |
| 2005/0173839 A1 | 8/2005 | Crump et al. |
| 2006/0189712 A1* | 8/2006 | Kondo .................. C09D 11/40 |
| | | 523/160 |
| 2007/0205528 A1 | 9/2007 | Patel et al. |
| 2007/0229497 A1 | 10/2007 | Zinniel et al. |
| 2008/0006966 A1 | 1/2008 | Mannella |
| 2008/0071030 A1 | 3/2008 | Priedman, Jr. |
| 2008/0103226 A1* | 5/2008 | Xu ........................ B33Y 70/00 |
| | | 522/130 |
| 2009/0093383 A1 | 4/2009 | Cernohous |
| 2009/0295032 A1 | 12/2009 | Hopkins |
| 2010/0047583 A1* | 2/2010 | Miles .................... C08G 59/50 |
| | | 428/413 |
| 2010/0104832 A1 | 4/2010 | Messe et al. |
| 2010/0279026 A1* | 11/2010 | Treadway ............... C08J 7/043 |
| | | 427/515 |
| 2010/0288194 A1 | 11/2010 | Stockwell et al. |
| 2010/0304088 A1* | 12/2010 | Steeman ............... C08G 59/68 |
| | | 522/170 |
| 2010/0327493 A1 | 12/2010 | Fong et al. |
| 2011/0244393 A1 | 10/2011 | Ikeda |
| 2012/0189729 A1 | 7/2012 | Pax |
| 2012/0259031 A1* | 10/2012 | Dake ..................... B33Y 70/00 |
| | | 522/27 |
| 2013/0078013 A1 | 3/2013 | Chillscyzn et al. |
| 2013/0172509 A1 | 7/2013 | Pawloski et al. |
| 2013/0186549 A1 | 7/2013 | Comb et al. |
| 2013/0186558 A1 | 7/2013 | Comb et al. |
| 2013/0292881 A1 | 11/2013 | Steiner et al. |
| 2014/0027950 A1 | 1/2014 | Stockwell et al. |
| 2014/0044822 A1 | 2/2014 | Mulliken |
| 2014/0070461 A1 | 3/2014 | Pax |
| 2014/0074274 A1 | 3/2014 | Douglas et al. |
| 2014/0107314 A1 | 4/2014 | Kawato et al. |
| 2014/0117585 A1 | 5/2014 | Douglas et al. |
| 2014/0120196 A1 | 5/2014 | Schmehl |
| 2014/0121813 A1 | 5/2014 | Schmehl |
| 2014/0170313 A1* | 6/2014 | Jogikalmath ........... D21H 21/34 |
| | | 427/244 |
| 2014/0239527 A1 | 8/2014 | Lee |
| 2014/0371895 A1 | 12/2014 | Sadusk et al. |
| 2015/0014881 A1 | 1/2015 | Elsey |
| 2015/0024169 A1 | 1/2015 | Martin |
| 2015/0024319 A1 | 1/2015 | Martin |
| 2015/0043225 A1 | 2/2015 | Goodman et al. |
| 2015/0093588 A1 | 4/2015 | Sadusk et al. |
| 2015/0227062 A1 | 8/2015 | Martin |
| 2015/0227070 A1 | 8/2015 | Martin |
| 2015/0261196 A1 | 9/2015 | Wilson et al. |
| 2015/0266237 A1 | 9/2015 | Comb et al. |
| 2016/0001461 A1 | 1/2016 | Gardiner et al. |
| 2016/0023373 A1 | 1/2016 | Demuth et al. |
| 2016/0023403 A1 | 1/2016 | Ramos et al. |
| 2016/0039151 A1 | 2/2016 | Pax |
| 2016/0046079 A1 | 2/2016 | Belelie et al. |
| 2016/0107383 A1 | 4/2016 | Dikovsky et al. |
| 2016/0121550 A1 | 5/2016 | Douglas et al. |
| 2016/0151856 A1 | 6/2016 | Cook |
| 2016/0167306 A1 | 6/2016 | Vidimce et al. |
| 2016/0257843 A1 | 9/2016 | Boydston et al. |
| 2016/0332381 A1 | 11/2016 | Long et al. |
| 2016/0347005 A1 | 12/2016 | Miller |
| 2016/0376453 A1 | 12/2016 | Hearon |
| 2016/0378004 A1 | 12/2016 | Martin |
| 2017/0036394 A1 | 2/2017 | Schmehl |
| 2017/0050374 A1 | 2/2017 | Minardi et al. |
| 2017/0120535 A1 | 5/2017 | MacCurdy et al. |
| 2017/0173892 A1 | 6/2017 | Steele |
| 2017/0174932 A1 | 6/2017 | Granlund et al. |
| 2017/0190114 A1 | 7/2017 | Sweeney et al. |
| 2017/0226267 A1 | 8/2017 | Shinohara et al. |
| 2017/0239890 A1 | 8/2017 | Folkins et al. |
| 2017/0291357 A1 | 10/2017 | Fong et al. |
| 2017/0306171 A1 | 10/2017 | Vidavsky et al. |
| 2017/0326795 A1 | 11/2017 | Facci et al. |
| 2017/0355147 A1 | 12/2017 | Buller et al. |
| 2018/0009932 A1 | 1/2018 | Hearon et al. |
| 2018/0036972 A1 | 2/2018 | Talgorn et al. |

(56) References Cited

U.S. PATENT DOCUMENTS

| | | | |
|---|---|---|---|
| 2018/0056582 A1 | 3/2018 | Matusik et al. |
| 2018/0057414 A1 | 3/2018 | O'Brien et al. |
| 2018/0071987 A1 | 3/2018 | Tsumuraya et al. |
| 2018/0136632 A1 | 5/2018 | Ochiai |
| 2018/0141268 A1 | 5/2018 | Holt |
| 2018/0148380 A1 | 5/2018 | Eckel et al. |
| 2018/0207874 A1 | 7/2018 | Sadusk et al. |
| 2018/0243941 A1 | 8/2018 | Demuth et al. |
| 2018/0281295 A1 | 10/2018 | Tibbits et al. |
| 2018/0297287 A1 | 10/2018 | Dikovsky et al. |
| 2018/0339426 A1 | 11/2018 | Demuth et al. |
| 2018/0370120 A1 | 12/2018 | Pawloski et al. |
| 2019/0039321 A1 | 2/2019 | Matzner et al. |
| 2019/0048217 A1 | 2/2019 | Vidavsky et al. |
| 2019/0099965 A1 | 4/2019 | Pawloski et al. |
| 2019/0127517 A1 | 5/2019 | Vidavsky et al. |
| 2019/0210354 A1 | 7/2019 | Vidavsky et al. |
| 2019/0217526 A1 | 7/2019 | Sadusk et al. |
| 2019/0283316 A1 | 9/2019 | Rolland et al. |
| 2019/0322031 A1 | 10/2019 | Kritchman |
| 2019/0337117 A1 | 11/2019 | Ganapathiappan et al. |
| 2019/0389139 A1 | 12/2019 | Wu et al. |
| 2020/0002466 A1 | 1/2020 | Burtovyy et al. |
| 2020/0156298 A1 | 5/2020 | Jessen et al. |
| 2020/0183276 A1 | 6/2020 | Weitekamp |
| 2020/0207025 A1 | 7/2020 | Priedeman |
| 2020/0207070 A1 | 7/2020 | Vidavsky et al. |
| 2020/0238601 A1 | 7/2020 | Pachaly et al. |
| 2020/0263057 A1* | 8/2020 | Gordon | C08K 5/49 |
| 2020/0346397 A1 | 11/2020 | Vidavsky et al. |
| 2020/0399484 A1* | 12/2020 | Yoo | C09D 11/102 |
| 2021/0060869 A1 | 3/2021 | Kuester et al. |
| 2021/0331384 A1 | 10/2021 | Post et al. |
| 2022/0088850 A1 | 3/2022 | Twiddy et al. |

FOREIGN PATENT DOCUMENTS

| | | | | |
|---|---|---|---|---|
| EP | 1137450 | B1 | 8/2006 |
| EP | 1015215 | B1 | 3/2008 |
| EP | 1087862 | B1 | 6/2008 |
| EP | 1590149 | B1 | 10/2008 |
| EP | 1501669 | B1 | 11/2010 |
| EP | 1497093 | B1 | 12/2011 |
| EP | 1388051 | B1 | 12/2016 |
| EP | 1552459 | B1 | 12/2016 |
| EP | 2892703 | B1 | 7/2018 |
| EP | 2188114 | B1 | 9/2018 |
| EP | 3022609 | B1 | 11/2018 |
| EP | 3467592 | A1 | 4/2019 |
| EP | 2121266 | B1 | 9/2019 |
| EP | 2969487 | B1 | 9/2020 |
| JP | 2015128884 | A | 7/2015 |
| JP | 2015221516 | A | 12/2015 |
| JP | 2016087831 | A | 5/2016 |
| WO | WO 1997028941 | A1 | 8/1997 |
| WO | WO 1998053974 | A1 | 12/1998 |
| WO | WO 1999037453 | A1 | 7/1999 |
| WO | WO 1999037454 | A1 | 7/1999 |
| WO | WO 1999037456 | A1 | 7/1999 |
| WO | WO 1999037457 | A1 | 7/1999 |
| WO | WO 2002093360 | A1 | 11/2002 |
| WO | WO 2003089218 | A1 | 10/2003 |
| WO | WO 2003089222 | A1 | 10/2003 |
| WO | WO 2004003823 | A1 | 1/2004 |
| WO | WO 2008008116 | A1 | 1/2008 |
| WO | WO-2008071575 | A1 | 6/2008 |
| WO | WO 2008112061 | A1 | 9/2008 |
| WO | WO 2014039825 | A2 | 3/2014 |
| WO | WO 2014152798 | A1 | 9/2014 |
| WO | WO 2015006439 | A1 | 1/2015 |
| WO | WO 2015009788 | A1 | 1/2015 |
| WO | WO 2015142493 | A1 | 9/2015 |
| WO | WO 2016063282 | A1 | 4/2016 |
| WO | WO 2017068590 | A1 | 4/2017 |
| WO | WO 2017112687 | A1 | 6/2017 |
| WO | WO 2017134673 | A1 | 8/2017 |
| WO | WO 2017134674 | A1 | 8/2017 |
| WO | WO 2017134676 | A1 | 8/2017 |
| WO | WO 2017187434 | A1 | 11/2017 |
| WO | WO 2018026829 | A1 | 2/2018 |
| WO | WO 2018033296 | A1 | 2/2018 |
| WO | WO-2019012103 | A1 | 1/2019 |
| WO | WO-2019121093 | A1 * | 6/2019 | .......... B41M 7/0081 |
| WO | WO 2019125296 | A1 | 6/2019 |
| WO | WO 2019212353 | A1 | 11/2019 |
| WO | WO 2020093030 | A1 | 5/2020 |
| WO | WO-2020123479 | A1 | 6/2020 |
| WO | WO 2021086392 | A1 | 5/2021 |
| WO | WO-2021252740 | A1 | 12/2021 |
| WO | WO-2022067027 | A1 | 3/2022 |

OTHER PUBLICATIONS

Eivgi, O. et al. (2020) "Latent Ruthenium Benzylidene Phosphite Complexes for Visible-Light-Induced Olefin Metathesis" ACS Catal, 10(3):2033-2038.

Froehling, P. (Jul. 2004) "Development of DSM's hybrane® hyperbranched polyesteramides" J Polymer Science. Part A: Polymer Chemistry, 42(13):3110-3115.

Ligon, S.C. et al. (2017) "Polymers for 3D printing and customized additive manufacturing" Chemical Reviews, 117(15):10212-10290.

Mendes-Felipe, C. et al. (2019) "State-of-the-Art and Future Challenges of UV Curable Polymer-Based Smart Materials for Printing Technologies" Advanced Materials Technologies, 4(3):1800618; 16 pages.

Sertoglu, K. (May 26, 2020) "Hybrid Manufacturing Technologies To 3D Print Parts With 'Injection Molding Quality'" 3D Printing Industry [online]. Retreived Sep. 23, 2020 from https://3dprintingindustry.com/news/hybrid-manufacturing-technologies-to-3d-print-parts-with-injection-molding-quality-171991; 4 printed pages.

Sitthi-Amorn, P. et al. (2015) "MultiFab: a machine vision assisted platform for multi-material 3D printing" ACM Transactions on Graphics (TOG), 34(4):Article 129; 11 pages.

Wikipedia "Reaction injection molding" [online]. Retrieved on Sep. 23, 2020 from https://en.wikipedia.org/wiki/Reaction_injection_molding; 2 printed pages.

CAS No. 28064-14-4, Epoxy phenol novalac resin, Nov. 16, 1984, 1 page.

CAS No. 1675-54-3, Bisphenol A diglycidyl ether, Nov. 16, 1984, 2 pages.

CAS No. 2095-03-6, Bisphenol F diglycidyl ether, Nov. 16, 1984, 1 page.

International Search Report and Written Opinion, mailed Apr. 8, 2020 for International Application No. PCT/US2019/065436 (10 total pages).

International Search Report and Written Opinion, mailed Sep. 23, 2021, for International Application No. PCT/US2021/036777 (10 total pages).

International Preliminary Report on Patentability for International Application No. PCT/US2021/036777 dated Dec. 22, 2022, 8 pages.

International Preliminary Report on Patentability, mailed Jun. 24, 2021, for International Application No. PCT/US2019/065436 (9 total pages).

\* cited by examiner

MATERIALS FOR PHOTOINITIATED CATIONIC RING-OPENING POLYMERIZATION AND USES THEREOF

RELATED APPLICATION

This application is a continuation of International Application No. PCT/US2021/036777, filed Jun. 10, 2021, which claims priority to, and the benefit of, U.S. Provisional Application No. 63/037,226, filed Jun. 10, 2020, the entire contents of each of which are incorporated herein by reference.

BACKGROUND

Additive manufacturing, also known to as 3D printing, refers to a relatively wide class of techniques for producing parts according to a computer-controlled process, generally to match a desired 3D specification, for example, a solid model. A number of different classes of materials have been used for such 3D printing, with different materials providing corresponding advantages and/disadvantages for different fabrication techniques. For example, a survey of materials may be found in Ligon et al. (*Chemical Reviews* 117 (15): 10212-10290 (2017)).

A class of fabrication techniques jets material for deposition on a partially fabricated object using inkjet printing technologies. The jetted material is typically UV cured shortly after it deposited, forming thin layers of cured material. To achieve precision fabrication, some techniques use mechanical approaches to maintain accurate layer-to-layer structure, for example, using mechanical rollers or "planarizers" to control the surface geometry, and therefore control the accuracy of the fabricated object. Therefore, rapid curing is a key feature to allow the planarization and obtain an accurately fabricated object. However, the resulting material properties obtained with such inks may be insufficient.

There is a need for novel materials which may be used as inks in 3D printing. The present disclosure addresses this need.

SUMMARY

In some aspects, the present disclosure provides a combination comprising:
(i) a ring-containing agent; and
(ii) a polyol.

In some aspects, the present disclosure provides a combination comprising:
(i) a ring-containing agent;
(ii) a polyol; and
(iii) a curing catalyst (e.g., photoinitiator).

In some aspects, the present disclosure provides a combination comprising:
(i) a ring-containing agent;
(ii) a polyol;
(iii) a curing catalyst (e.g., photoinitiator); and
(iv) a sensitizer.

In some aspects, the present disclosure provides a build material comprising a combination disclosed herein.

In some aspects, the present disclosure provides a build material comprising:
(i) a ring-containing agent; and
(ii) a polyol.

In some aspects, the present disclosure provides a build material comprising:
(i) a ring-containing agent;
(ii) a polyol; and
(iii) a curing catalyst (e.g., photoinitiator).

In some aspects, the present disclosure provides a build material comprising:
(i) a ring-containing agent;
(ii) a polyol;
(iii) a curing catalyst (e.g., photoinitiator); and
(iv) a sensitizer.

In some aspects, the present disclosure provides a kit comprising a combination disclosed herein.

In some aspects, the present disclosure provides a kit comprising:
a first build material comprising:
(i) a ring-containing agent and/or a polyol; and
(ii) a curing catalyst; and
a second build material comprising:
(iii) a ring-containing agent and/or a polyol; and
(iv) a sensitizer.

In some aspects, the present disclosure provides a kit comprising:
a build material comprising:
(i) a ring-containing agent and/or a polyol; and
(ii) a curing catalyst; and
a support material.

In some aspects, the present disclosure provides a kit comprising:
a build material comprising:
(i) a ring-containing agent and/or a polyol;
(ii) a curing catalyst; and
(iii) a sensitizer; and
a support material.

In some aspects, the present disclosure provides a kit comprising:
a first build material comprising:
(i) a ring-containing agent and/or a polyol; and
(ii) a curing catalyst;
a second build material comprising:
(iii) a ring-containing agent and/or a polyol; and
(iv) a sensitizer; and
a support material.

In some aspects, the present disclosure provides a method of preparing a cured material, comprising a step of subjecting a combination, build material, or kit disclosed herein to a curing condition.

In some aspects, the present disclosure provides a combination, build material, or kit disclosed herein for use in preparing a cured material, wherein the preparation comprises a step of subjecting the combination, build material, or kit to a curing condition.

In some aspects, the present disclosure provides use of a combination, build material, or kit disclosed herein in the manufacture of a cured material, wherein the manufacture comprises a step of subjecting the combination, build material, or kit to a curing condition.

In some aspects, the present disclosure provides a cured material being prepared by a method described herein.

In some aspects, the present disclosure provides a method of printing an object using a combination, build material, or kit disclosed herein.

In some aspects, the present disclosure provides a combination, build material, or kit disclosed herein for use in printing an object.

In some aspects, the present disclosure provides a system for 3D printing, comprising:
(i) a printer (e.g., an inkjet printer); and
(ii) an ink comprising a combination disclosed herein.

Unless otherwise defined, all technical and scientific terms used herein have the same meaning as commonly understood by one of ordinary skill in the art to which this disclosure belongs. In the specification, the singular forms also include the plural unless the context clearly dictates otherwise. Although methods and materials similar or equivalent to those described herein can be used in the practice or testing of the present disclosure, suitable methods and materials are described below. All publications, patent applications, patents and other references mentioned herein are incorporated by reference. The references cited herein are not admitted to be prior art to the claimed invention. In the case of conflict, the present specification, including definitions, will control. In addition, the materials, methods and examples are illustrative only and are not intended to be limiting. In the case of conflict between the chemical structures and names of the compounds disclosed herein, the chemical structures will control.

Other features and advantages of the disclosure will be apparent from the following detailed description and claims.

DETAILED DESCRIPTION

Figure 1:
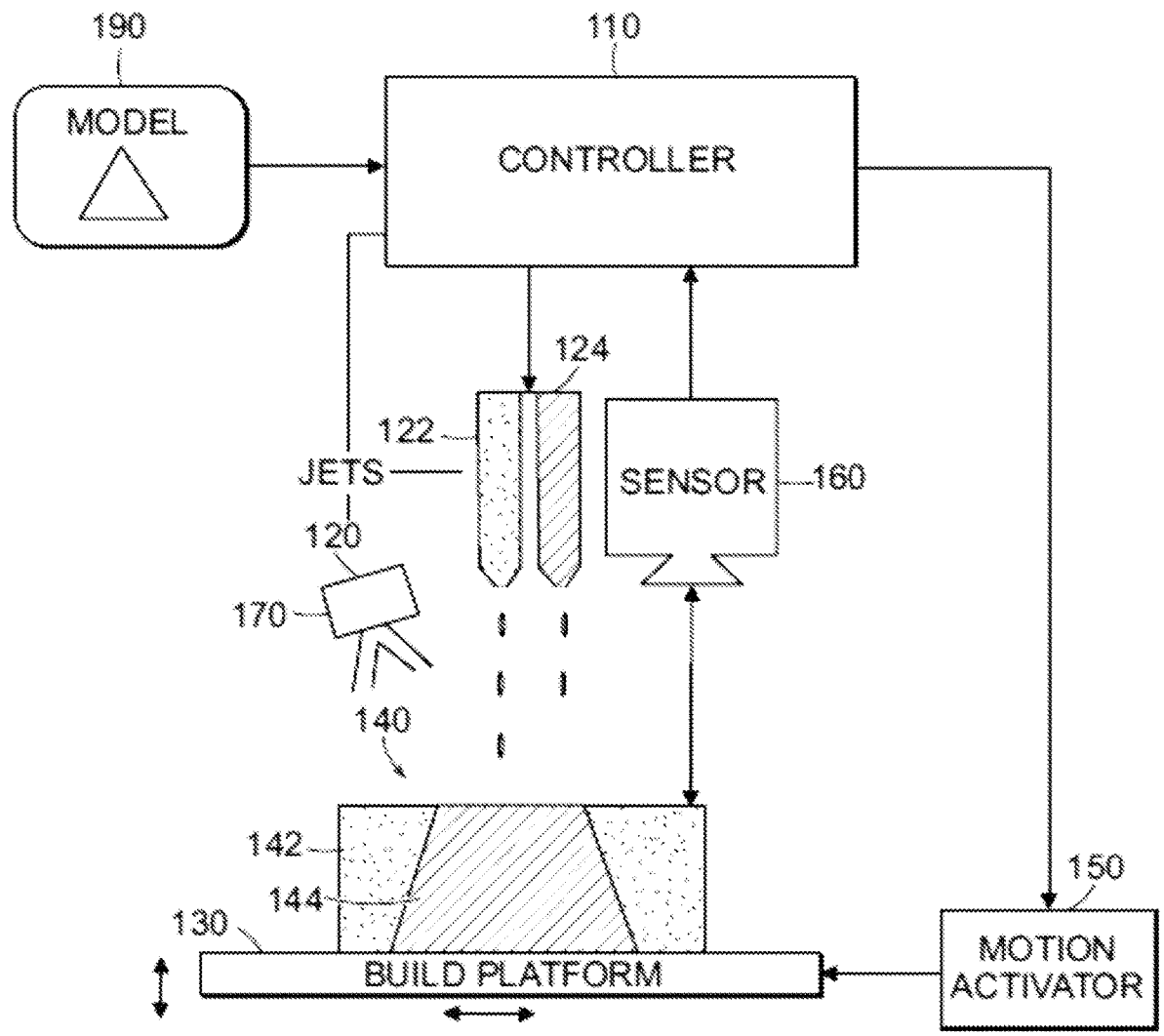
FIG. 1 is a schematic diagram of an exemplary 3D printer.

Without wishing to be bound by theory, the present disclosure relates to discovery of novel materials for photoinitiated cationic ring-opening polymerization (ROP). Such materials may be suitable for being used as ink for 3D printing. In some embodiments, the materials may allow for a 3D printing process that does not require any contact to control the surface geometry of the object being printed, e.g., a 3D printing process using a non-contact (e.g., optical) feedback approach.

Suitable applications and systems for the materials of the present disclosure are described, e.g., in U.S. Provisional Appl'n No. 62/777,422 and PCT Appl'n No. PCT/US2019/065436 (incorporated herein by reference).

Combinations, Materials, and Kits of the Present Disclosure

In some aspects, the present disclosure provides a combination, material, or kit for photoinitiated cationic ring-opening polymerization (ROP).

In some aspects, the present disclosure provides a combination comprising:
(i) a ring-containing agent; and
(ii) a polyol.

In some aspects, the present disclosure provides a combination comprising:
(i) a ring-containing agent;
(ii) a polyol; and
(iii) a curing catalyst (e.g., photoinitiator).

In some aspects, the present disclosure provides a combination comprising:
(i) a ring-containing agent;
(ii) a polyol;
(iii) a curing catalyst (e.g., photoinitiator); and
(iv) a sensitizer.

In some aspects, the present disclosure provides a build material comprising a combination disclosed herein.

In some aspects, the present disclosure provides a build material comprising:
(i) a ring-containing agent; and
(ii) a polyol.

In some aspects, the present disclosure provides a build material comprising:
(i) a ring-containing agent;
(ii) a polyol; and
(iii) a curing catalyst (e.g., photoinitiator).

In some aspects, the present disclosure provides a build material comprising:
(i) a ring-containing agent;
(ii) a polyol;
(iii) a curing catalyst (e.g., photoinitiator); and
(iv) a sensitizer.

In some aspects, the present disclosure provides a kit comprising a combination disclosed herein.

In some aspects, the present disclosure provides a kit comprising:
a first build material comprising:
(i) a ring-containing agent and/or a polyol; and
(ii) a curing catalyst; and
a second build material comprising:
(iii) a ring-containing agent and/or a polyol; and
(iv) a sensitizer.

In some aspects, the present disclosure provides a kit comprising:
a build material comprising:
(i) a ring-containing agent and/or a polyol; and
(ii) a curing catalyst; and
a support material.

In some aspects, the present disclosure provides a kit comprising:
a build material comprising:
(i) a ring-containing agent and/or a polyol;
(ii) a curing catalyst; and
(iii) a sensitizer; and
a support material.

In some aspects, the present disclosure provides a kit comprising:
a first build material comprising:
(i) a ring-containing agent and/or a polyol; and
(ii) a curing catalyst;
a second build material comprising:
(iii) a ring-containing agent and/or a polyol; and
(iv) a sensitizer; and
a support material.

In some embodiments, the combination, build material, or kit further comprises a toughening agent.

In some embodiments, the combination, build material, or kit further comprises a stabilizer.

In some embodiments, the combination, material, or kit further comprises a surface tension modifier.

In some embodiments, the combination, material, or kit further comprises a colorant.

It is understood that, for a material described herein, the ring-containing agent, polyol, curing catalyst, sensitizer, and toughening agent can each be, where applicable, selected from the groups described herein, and any group described herein for any of ring-containing agent, polyol, curing catalyst, sensitizer, and toughening agent can be combined, where applicable, with any group described herein for one or more of the remainder of ring-containing agent, polyol, curing catalyst, sensitizer, and toughening agent.

Ring-Containing Agents

In some embodiments, the ring-containing agent comprises an oxirane agent, an oxetane agent, or a combination thereof.

In some embodiments, the ring-containing agent comprises at an oxirane agent.

In some embodiments, the ring-containing agent comprises at an oxetane agent.

In some embodiments, the ring-containing agent comprises at an oxirane agent and an oxetane agent.

In some embodiments, the ring-containing agent (e.g., the oxirane agent, oxetane agent, or combination thereof) is also a surface tension modifier.

In some embodiments, the oxirane agent is a monomer.

In some embodiments, the oxirane agent is a polymer.

In some embodiments, the ring-containing agent comprises:

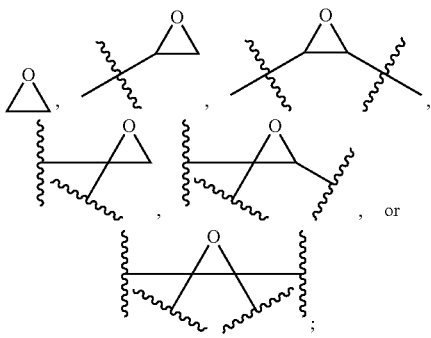

wherein each

independently denotes a direct or indirect attachment to a portion of the rest of the agent.

In some embodiments, each

independently denotes a substitution.

In some embodiments, the ring-containing agent comprises a cycloaliphatic moiety, a resorcinol moiety, a phenol formaldehyde moiety, a bisphenol moiety, or any combination thereof.

In some embodiments, the ring-containing agent comprises limonene dioxide, (3-4-epoxycyclohexane)methyl 3'-4'-epoxycyclohexyl-carboxylate, bis((3,4-epoxycyclohexyl)-methyl) adipate, 7-oxabicyclo[4.1.0]hept-3-ylmethyl (e.g., UviCure™ S105 or UviCure™ S105E), bis((3,4-epoxycyclohexyl)methyl) adipate (UviCure™ S128), 3-ethyloxetane-3-methanol (e.g., UviCure™ S130), 3-ethyl-3-[(phenylmethoxy)methyl]-oxetane (e.g., UviCure™ S140), 1,4-bis[(3-ethyl-3-oxetanylmethoxy)methyl]benzene (e.g., UviCure™ S150), 4,4-bis(3-ethyl-3-oxetanyl)methoxymethyl]biphenyl (e.g., UviCure™ S160), 3-ethyl-3-(methacryloyloxy)methyloxetane (e.g., UviCure™ S170), EPALLOY® 5000, EPALLOY® 5001LC, EPALLOY® 5200, EPALLOY® 7200, EPALLOY® 9000, ERISYS® RDGE, ERISYS® RDGE-H, EPALLOY® 8220, EPALLOY® 8230, EPALLOY® 8240, EPALLOY® 8250, EPALLOY® 8280, EPALLOY® 7192, ERISYS® RF-50, ERISYS® RN-25, ERISYS® RN-3650, EPALLOY® 9237-70, EPALLOY® 7138, EPALLOY® 7170, ERISYS® GE-60, ERISYS® GE-61, ERISYS® EGDGE, ERISYS® GE-20, ERISYS® GE-21, ERISYS® GE-22, ERISYS® GE-24, ERISYS® GE-25, ERISYS® GE-29, ERISYS® GE-30, ERISYS® GE-31, ERISYS® GE-35, ERISYS® GE-35 H, ERISYS® GE-36, ERISYS® GE-38, ERISYS® GE-40, ERISYS® GA-240, ERISYS® GS-110, ERISYS® GS-120, ERISYS® GE-5, ERISYS® GE-6, ERISYS® GE-7, ERISYS® GE-8, ERISYS® GE-10, ERISYS® GE-11, ERISYS® GE-13, sorbitol polyglycidyl ether, ethylene glycol digylcidyl ether, neopentyl glycol diglycidyl ether, 1,4-butanediol diglycidyl ether, cyclohexanedimethanol diglycidyl ether, polypropylene glycol diglycidyl ether, 1,6-hexanediol diglycidyl ether, diglycidyl ether of brominated neopentyl glycol, trimethylolpropane triglycidyl ether, trimethylolethane triglycidyl ether, castor oil triglycidyl ether, castor oil glycidyl ether, propoxylated glycerin triglycidyl ether, polyglycerol-3-polyglycidyl ether, epoxidized pentaerythritol, epoxidized cyclohexanedimethanol, epoxidized meta-xylylenediamine, glycidyl ester of neodecanoic acid, glycidyl ester of dimer acid, n-butyl glycidyl ether, 2-ethylhexyl glycidyl ethe, $C_8$-$C_{10}$ aliphatic glycidyl ether, $C_{12}$-$C_{14}$ aliphatic glycidyl ether, o-cresyl glycidyl ether, p-tertiary butyl phenyl glycidyl ether, phenyl glycidyl ether, Silmer® EPC C50, Silmer® EPC F418-F, Silmer® EP D208, Silmer® EPC Di-50, or any combination thereof.

In some embodiments, the ring-containing agent comprises limonene dioxide, (3-4-epoxycyclohexane)methyl 3'-4'-epoxycyclohexyl-carboxylate, bis((3,4-epoxycyclohexyl)-methyl) adipate, or any combination thereof.

In some embodiments, the ring-containing agent comprises 7-oxabicyclo[4.1.0]hept-3-ylmethyl (e.g., UviCure™ S105 or UviCure™ S105E), bis((3,4-epoxycyclohexyl) methyl) adipate (UviCure™ S128), 3-ethyloxetane-3-methanol (e.g., UviCure™ S130), 3-ethyl-3-[(phenylmethoxy)methyl]-oxetane (e.g., UviCure™ S140), 1,4-bis [(3-ethyl-3-oxetanylmethoxy)methyl]benzene (e.g., UviCure™ S150), 4,4-bis(3-ethyl-3-oxetanyl)methoxymethyl]biphenyl (e.g., UviCure™ S160), 3-ethyl-3-(methacryloyloxy)methyloxetane (e.g., UviCure™ S170), or any combination thereof.

In some embodiments, the ring-containing agent comprises 7-oxabicyclo[4.1.0]hept-3-ylmethyl (e.g., UviCure™ S105 or UviCure™ S105E).

In some embodiments, the ring-containing agent comprises UviCure™ S105.

In some embodiments, the UviCure™ S105 is present at a concentration of about 50±30% w/w, about 50±20% w/w, about 50±10% w/w, about 50±5% w/w, about 50±4% w/w, about 50±3% w/w, about 50±2% w/w, or about 50±1% w/w (e.g., about 50% w/w).

In some embodiments, the UviCure™ S105 is present at a concentration of about 50±30% w/w, about 40±20% w/w, about 40±10% w/w, about 40±5% w/w, about 40±4% w/w, about 40±3% w/w, about 40±2% w/w, or about 40±1% w/w (e.g., about 40% w/w).

In some embodiments, the UviCure™ S105 is present at a concentration of about 20±10% w/w, about 20±5% w/w, about 20±4% w/w, about 20±3% w/w, about 20±2% w/w, or about 20±1% w/w (e.g., about 20% w/w).

In some embodiments, the UviCure™ S105 is present at a concentration of about 5±3% w/w, about 5±2% w/w, about 5±1% w/w, about 5±0.9% w/w, about 5±0.8% w/w, about 5±0.7% w/w, about 5±0.6% w/w, about 5±0.5% w/w, about 5±0.4% w/w, about 5±0.3% w/w, about 5±0.2% w/w, or about 5±0.1% w/w (e.g., about 5% w/w).

In some embodiments, the ring-containing agent comprises a commercially available composition under the trademark EPALLOY®.

In some embodiments, the ring-containing agent comprises EPALLOY® 5000, EPALLOY® 5001LC, EPALLOY® 5200, or any combination thereof.

In some embodiments, the ring-containing agent comprises EPALLOY® 7200, EPALLOY® 9000, or a combination thereof.

In some embodiments, the ring-containing agent comprises a commercially available composition under the trademark ERISYS®.

In some embodiments, the ring-containing agent comprises ERISYS® RDGE, ERISYS® RDGE-H, or a combination thereof.

In some embodiments, the ring-containing agent comprises EPALLOY® 8220, EPALLOY® 8230, EPALLOY® 8240, EPALLOY® 8250, EPALLOY® 8280, or any combination thereof.

In some embodiments, the ring-containing agent comprises EPALLOY® 7192.

In some embodiments, the ring-containing agent comprises EPALLOY® 8220.

In some embodiments, the EPALLOY® 8220 is present at a concentration of about 20±10% w/w, about 20±5% w/w, about 20±4% w/w, about 20±3% w/w, about 20±2% w/w, or about 20±1% w/w (e.g., about 20% w/w).

In some embodiments, the EPALLOY® 8215 is present at a concentration of about 15±10% w/w, about 15±5% w/w, about 15±4% w/w, about 15±3% w/w, about 15±2% w/w, or about 15±1% w/w (e.g., about 15% w/w).

In some embodiments, the ring-containing agent comprises ERISYS® RF-50, ERISYS® RN-25, ERISYS® RN-3650, or any combination thereof.

In some embodiments, the ring-containing agent comprises EPALLOY® 9237-70, EPALLOY® 7138, EPALLOY® 7170, or any combination thereof.

In some embodiments, the ring-containing agent comprises ERISYS® GE-60, ERISYS® GE-61, ERISYS® EGDGE, ERISYS® GE-20, ERISYS® GE-21, ERISYS® GE-22, ERISYS® GE-24, ERISYS® GE-25, ERISYS® GE-29, ERISYS® GE-30, ERISYS® GE-31, ERISYS® GE-35, ERISYS® GE-35 H, ERISYS® GE-36, ERISYS® GE-38, ERISYS® GE-40, ERISYS® GA-240, ERISYS® GS-110, ERISYS® GS-120, ERISYS® GE-5, ERISYS® GE-6, ERISYS® GE-7, ERISYS® GE-8, ERISYS® GE-10, ERISYS® GE-11, ERISYS® GE-13, or any combination thereof.

In some embodiments, the ring-containing agent comprises ERISYS® GE-13.

In some embodiments, the ERISYS® GE-13 is present a concentration of about 10±5% w/w, about 10±4% w/w, about 10±3% w/w, about 10±2% w/w, about 10±1% w/w, about 10±0.9% w/w, about 10±0.8% w/w, about 10±0.7% w/w, about 10±0.6% w/w, about 10±0.5% w/w, about 10±0.4% w/w, about 10±0.3% w/w, about 10±0.2% w/w, or about 10±0.1% w/w (e.g., about 10% w/w).

In some embodiments, the ring-containing agent comprises sorbitol polyglycidyl ether, ethylene glycol digylcidyl ether, neopentyl glycol diglycidyl ether, 1,4-butanediol diglycidyl ether, cyclohexanedimethanol diglycidyl ether, polypropylene glycol diglycidyl ether, 1,6-hexanediol diglycidyl ether, diglycidyl ether of brominated neopentyl glycol, trimethylolpropane triglycidyl ether, trimethylolethane triglycidyl ether, castor oil triglycidyl ether, castor oil glycidyl ether, propoxylated glycerin triglycidyl ether, polyglycerol-3-polyglycidyl ether, epoxidized pentaerythritol, epoxidized cyclohexanedimethanol, or any combination thereof.

In some embodiments, the ring-containing agent comprises epoxidized meta-xylylenediamine.

In some embodiments, the ring-containing agent comprises glycidyl ester of neodecanoic acid, glycidyl ester of dimer acid, or a combination thereof.

In some embodiments, the ring-containing agent comprises n-butyl glycidyl ether, 2-ethylhexyl glycidyl ethe, $C_8$-$C_{10}$ aliphatic glycidyl ether, $C_{12}$-$C_{14}$ aliphatic glycidyl ether, or any combination thereof.

In some embodiments, the ring-containing agent comprises o-cresyl glycidyl ether, p-tertiary butyl phenyl glycidyl ether, phenyl glycidyl ether, or any combination thereof.

In some embodiments, the ring-containing agent comprises a commercially available composition under the trademark Silmer®.

In some embodiments, the ring-containing agent comprises Silmer® EPC C50, Silmer® EPC F418-F, Silmer® EP D208, Silmer® EPC Di-50, or any combination thereof.

In some embodiments, the ring-containing agent comprises Silmer® EPC F418-F.

In some embodiments, the oxirane agent is present at a concentration of about 99% w/w or less, about 98% w/w or less, about 97% w/w or less, about 96% w/w or less, about 95% w/w or less, about 90% w/w or less, about 85% w/w or less, about 80% w/w or less, about 75% w/w or less, about 70% w/w or less, about 65% w/w or less, or about 60% w/w or less.

In some embodiments, the oxirane agent is present at a concentration of about 1% w/w or more, about 2% w/w or more, about 3% w/w or more, about 4% w/w or more, about 5% w/w or more, about 10% w/w or more, about 15% w/w or more, about 20% w/w or more, about 25% w/w or more, about 30% w/w or more, about 35% w/w or more, about 40% w/w or more, about 45% w/w or more, or about 50% w/w or more.

In some embodiments, the oxirane agent is present at a concentration of about 45±20% w/w, about 45±15% w/w, about 45±10% w/w, about 45±8% w/w, about 45±6% w/w, about 45±5% w/w, about 45±4% w/w, about 45±% w/w, about 45±2% w/w, about 45±1% w/w (e.g., about 45% w/w).

In some embodiments, the oxirane agent is present at a concentration of about 55±20% w/w, about 55±15% w/w, about 55±10% w/w, about 55±8% w/w, about 55±6% w/w, about 55±5% w/w, about 55±4% w/w, about 55±% w/w, about 55±2% w/w, about 55±1% w/w (e.g., about 55% w/w).

In some embodiments, the oxirane agent is present at a concentration of about 65±20% w/w, about 65±15% w/w, about 65±10% w/w, about 65±8% w/w, about 65±6% w/w, about 65±5% w/w, about 65±4% w/w, about 65±% w/w, about 65±2% w/w, about 65±1% w/w (e.g., about 65% w/w).

In some embodiments, the oxetane agent is a monomer.
In some embodiments, the oxetane agent is a polymer.
In some embodiments, the oxetane agent comprises:

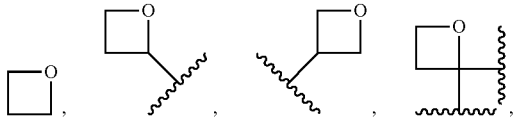

-continued

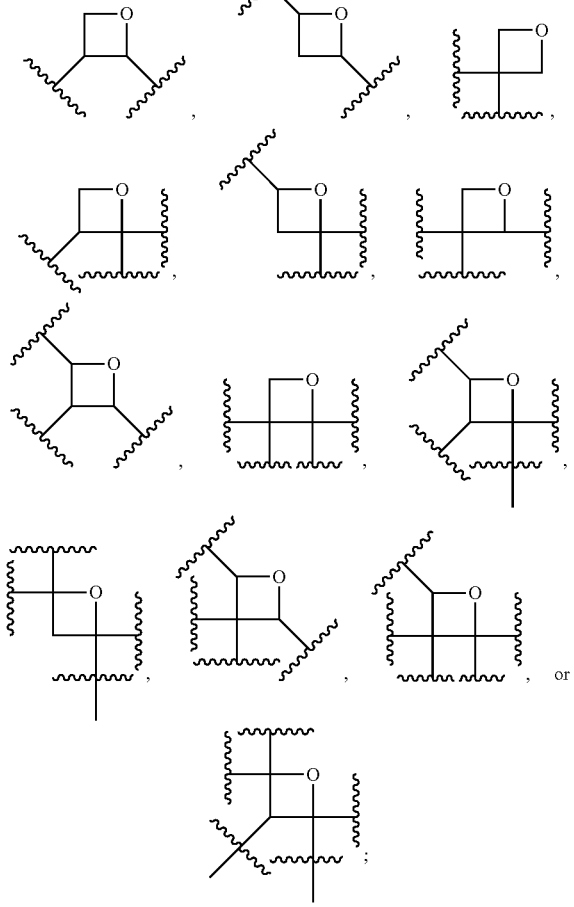

wherein each

independently denotes a direct or indirect attachment to a portion of the rest of the agent.

In some embodiments, each

independently denotes an substitution.

In some embodiments, the oxetane agent comprises 3-ethyl-3-[(phenylmethoxy)methyl]-oxetane, 1,4-bis[(3-ethyl-3-oxetanylmethoxy)methyl]benzene, 3-ethyloxetane-3-methanol, 4,4-bis(3-ethyl-3-oxetanyl)methoxymethyl]biphenyl, 3-ethyl-3-(methacryloyloxy)methyloxetane, or any combination thereof.

In some embodiments, the oxetane agent comprises 3-ethyl-3-[(phenylmethoxy)methyl]-oxetane.

In some embodiments, the oxetane agent comprises 1,4-bis[(3-ethyl-3-oxetanylmethoxy)-methyl]benzene.

In some embodiments, the oxetane agent comprises 3-ethyloxetane-3-methanol.

In some embodiments, the oxetane agent comprises 4,4-bis(3-ethyl-3-oxetanyl)methoxymethyl]biphenyl.

In some embodiments, the oxetane agent comprises 3-ethyl-3-(methacryloyloxy)methyloxetane.

In some embodiments, the oxetane agent is present at a concentration of about 60% w/w or less, about 55% w/w or less, about 50% w/w or less, about 45% w/w or less, about 40% w/w or less, about 35% w/w or less, about 30% w/w or less, about 25% w/w or less, or about 20% w/w or less.

In some embodiments, the oxetane agent is present at a concentration of about 1% w/w or more, about 2% w/w or more, about 3% w/w or more, about 4% w/w or more, about 5% w/w or more, about 10% w/w or more, or about 15% w/w or more.

In some embodiments, the oxetane agent is present at a concentration of about 15±10% w/w, about 15±8% w/w, about 15±6% w/w, about 15±5% w/w, about 15±4% w/w, about 15±% w/w, about 15±2% w/w, about 15±1% w/w (e.g., about 15% w/w).

In some embodiments, the oxetane agent is present at a concentration of about 20±15% w/w, about 20±10% w/w, about 20±8% w/w, about 20±6% w/w, about 20±5% w/w, about 20±4% w/w, about 20±% w/w, about 20±2% w/w, about 20±1% w/w (e.g., about 20% w/w).

In some embodiments, the oxetane agent is present at a concentration of about 25±15% w/w, about 25±10% w/w, about 25±8% w/w, about 25±6% w/w, about 25±5% w/w, about 25±4% w/w, about 25±% w/w, about 25±2% w/w, about 25±1% w/w (e.g., about 25% w/w).

Polyols

In some embodiments, the polyol comprises a diol, a triol, a tetrol, a dendritic polyol, or any combination thereof.

In some embodiments, the polyol comprises a diol.

In some embodiments, the polyol comprises a triol.

In some embodiments, the polyol comprises a tetrol.

In some embodiments, the polyol comprises a polyol.

In some embodiments, the polyol comprises polycaprolactone, polypropylene, polyethylene, or polytetrahydrofuran.

In some embodiments, the polyol comprises a polycaprolactone diol, a polypropylene diol, a polyethylene diol, or any combination thereof.

In some embodiments, the polyol comprises a polycaprolactone triol, a polypropylene triol, a polyethylene triol, or any combination thereof.

In some embodiments, the polyol comprises a polycaprolactone tetrol, a polypropylene tetrol, a polyethylene tetrol, or any combination thereof.

In some embodiments, the polyol comprises a polycaprolactone diol, a polycaprolactone triol, a polycaprolactone tetrol, or any combination thereof.

In some embodiments, the polyol (e.g., the polycaprolactone diol, polycaprolactone triol, or polycaprolactone tetrol) has a molecular weight of about 8000 or less, about 7500 or less, about 7000 or less, about 6500 or less, about 6000 or less, about 5500 or less, about 5000 or less, about 4500 or less, about 4000 or less, about 3500 or less, about 3400 or less, about 3300 or less, about 3200 or less, about 3100 or less, about 3000 or less, about 2900 or less, about 2800 or less, about 2700 or less, about 2600 or less, about 2500 or less, about 2400 or less, about 2300 or less, about 2200 or less, about 2100 or less, or about 2000 or less.

In some embodiments, the polyol (e.g., the polycaprolactone diol, polycaprolactone triol, or polycaprolactone tetrol) has a molecular weight of about 200 or more, about 300 or more, about 400 or more, about 500 or more, about 600 or more, about 700 or more, about 800 or more, about 900 or more, about 1000 or more, about 1100 or more, about 1200 or more, about 1300 or more, about 1400 or more, or about 1500 or more.

In some embodiments, the polyol comprises polycaprolactone diol.

In some embodiments, the polyol (e.g., polycaprolactone diol) has a molecular weight of about 2000±1500, about 2000±1400, about 2000±1300, about 2000±1200, about 2000±1100, about 2000±1000, about 2000±900, about 2000±800, about 2000±700, about 2000±600, about 2000±500, about 2000±400, about 2000±300, about 2000±200, about 2000±100, about 2000±50, about 2000±40, about 2000±30, about 2000±20, or about 2000±10 (e.g., about 2000).

In some embodiments, the polyol (e.g., polycaprolactone diol) has a molecular weight of about 530±300, about 530±200, about 530±100, about 530±50, about 530±40, about 530±30, about 530±20, or about 530±10 (e.g., about 530).

In some embodiments, the polyol is polycaprolactone diol having a molecular weight of about 530.

In some embodiments, the polycaprolactone diol (e.g., having a molecular weight of about 530) is present at a concentration of about 20±10% w/w, 20±5% w/w, 20±4% w/w, 20±3% w/w, 20±2% w/w, or 20±1% w/w (e.g., 20% w/w).

In some embodiments, the polyol comprises polycaprolactone triol.

In some embodiments, the polyol (e.g., polycaprolactone triol) has a molecular weight of about 900±600, about 900±500, about 900±400, about 900±300, about 900±200, about 900±100, about 900±50, about 900±40, about 900±30, about 900±20, or about 900±10 (e.g., about 900).

In some embodiments, the polyol (e.g., polycaprolactone triol) has a molecular weight of about 300±100, about 300±50, about 300±40, about 300±30, about 300±20, or about 300±10 (e.g., about 300).

In some embodiments, the polyol comprises a commercially available composition under the trademark Capa®.

In some embodiments, the polyol comprises Capa® 2043, Capa® 2047A, Capa® 2054J, Capa® 20610AJ, Capa® 2065, Capa® 3050J, Capa® 3031, Capa® 3091, Capa® 3050J, Capa® 3022, Capa® 4101, Capa® 8015D, or any combination thereof.

In some embodiments, the polyol comprises Capa® 2043, Capa® 3031, or a combination thereof.

In some embodiments, the Capa® 2043 is present at a concentration of 12.5±5% w/w, 12.5±4% w/w, 12.5±3% w/w, 12.5±2% w/w, or 12.5±1% w/w (e.g., 12.5% w/w).

In some embodiments, the Capa® 2043 is present at a concentration of 10±5% w/w, 10±4% w/w, 10±3% w/w, 10±2% w/w, or 10±1% w/w (e.g., 10% w/w).

In some embodiments, the Capa® 3031 is present at a concentration of about 20±10% w/w, 20±5% w/w, 20±4% w/w, 20±3% w/w, 20±2% w/w, or 20±1% w/w (e.g., 20% w/w).

In some embodiments, the Capa® 3031 is present at a concentration of about 15±10% w/w, 15±5% w/w, 15±4% w/w, 15±3% w/w, 15±2% w/w, or 15±1% w/w (e.g., 15% w/w).

In some embodiments, the Capa® 3031 is present at a concentration of 10±5% w/w, 10±4% w/w, 10±3% w/w, 10±2% w/w, or 10±1% w/w (e.g., 10% w/w).

In some embodiments, the polyol comprises Capromer™ PD4-05, Capromer™ PT1-05, Capromer™ PD1-10, Capromer™ PD1-20A, Capromer™ PD1-20, or any combination thereof.

In some embodiments, the polyol comprises Capromer™ PD4-05.

In some embodiments, the Capromer™ PD4-05 is present at a concentration of about 16±10% w/w, 16±5% w/w, 16±4% w/w, 16±3% w/w, 16±2% w/w, or 16±1% w/w (e.g., 16% w/w).

In some embodiments, the polyol comprises a polypropylene diol, a polypropylene triol, or a polypropylene tetrol.

In some embodiments, the polyol comprises a polypropylene glycol.

In some embodiments, the polyol (e.g., the polypropylene glycol) has a molecular weight of about 300 or more, about 400 or more, about 500 or more, about 600 or more, about 700 or more, about 800 or more, about 900 or more, about 1000 or more, about 1100 or more, about 1200 or more, about 1300 or more, about 1400 or more, about 1500 or more, about 2000 or more, about 2500 or more, about 3000 or more, about 3500 or more, about 4000 or more, about 4500 or more, or about 5000 or more.

In some embodiments, the polyol (e.g., the polypropylene glycol) has a molecular weight of about 8000 or less, about 7000 or less, about 6000 or less, about 5000 or less, about 4000 or less, about 3000 or less, about 2000 or less, about 1000 or less, about 900 or less, about 800 or less, about 700 or less, about 600 or less, about 500 or less, about 400 or less, or about 300 or less.

In some embodiments, the polyol (e.g., the polypropylene glycol) has a molecular weight of about 2700±1500, about 2700±1400, about 2700±1300, about 2700±1200, about 27001100, about 2700±1000, about 2700±900, about 2700±800, about 2700±700, about 2700±600, about 2700±500, about 2700±400, about 2700±300, about 2700±200, about 2700±100, about 2700±50, about 2700±40, about 2700±30, about 2700±20, or about 2700±10 (e.g., about 2700).

In some embodiments, the polyol (e.g., the polypropylene glycol) has a molecular weight of about 2000±1500, about 2000±1400, about 2000±1300, about 2000±1200, about 2000±1100, about 2000±1000, about 2000±900, about 2000±800, about 2000±700, about 2000±600, about 2000±500, about 2000±400, about 2000±300, about 2000±200, about 2000±100, about 2000±50, about 2000±40, about 2000±30, about 2000±20, or about 2000±10 (e.g., about 2000).

In some embodiments, the polyol (e.g., the polypropylene glycol) has a molecular weight of about 1500±1000, about 1500±900, about 1500±800, about 1500±700, about 1500±600, about 1500±500, about 1500±400, about 1500±300, about 1500±200, about 1500±100, about 1500±50, about 1500±40, about 1500±30, about 1500±20, or about 1500±10 (e.g., about 1500).

In some embodiments, the polyol (e.g., the polypropylene glycol) has a molecular weight of about 1000±600, about 1000±500, about 1000±400, about 1000±300, about 1000±200, about 1000±100, about 1000±50, about 1000±40, about 1000±30, about 1000±20, or about 1000±10 (e.g., about 1000).

In some embodiments, the polyol (e.g., the polypropylene glycol) has a molecular weight of about 725±400, about 725±300, about 725±200, about 725±100, about 725±50, about 725±40, about 725±30, about 725±20, or about 725±10 (e.g., about 725).

In some embodiments, the polyol (e.g., the polypropylene glycol) has a molecular weight of about 450±200, about 450±100, about 450±50, about 450±40, about 450±30, about 450±20, or about 450±10 (e.g., about 450).

In some embodiments, the polyol (e.g., the polypropylene glycol) has a molecular weight of about 425±200, about 425±100, about 425±50, about 425±40, about 425±30, about 425±20, or about 425±10 (e.g., about 425).

In some embodiments, the polyol comprises polypropylene glycol P400, polypropylene glycol P425, polypropylene glycol P1000, polypropylene glycol P1200, polypropylene glycol P2000, or any combination thereof.

In some embodiments, the polyol comprises a polyethylene diol, a polyethylene triol, or a polyethylene tetrol.

In some embodiments, the polyol comprises a polyethylene glycol.

In some embodiments, the polyol (e.g., the polyethylene glycol) has a molecular weight of about 300 or more, about 400 or more, about 500 or more, about 600 or more, about 700 or more, about 800 or more, about 900 or more, about 1000 or more, about 1100 or more, about 1200 or more, about 1300 or more, about 1400 or more, about 1500 or more, about 2000 or more, or about 2500 or more.

In some embodiments, the polyol (e.g., the polyethylene glycol) has a molecular weight of about 8000 or less, about 7000 or less, about 6000 or less, about 5000 or less, about 4000 or less, about 3500 or less, about 3000 or less, about 2000 or less, about 1000 or less, about 900 or less, about 800 or less, about 700 or less, about 600 or less, about 500 or less, about 400 or less, or about 300 or less.

In some embodiments, the polyol (e.g., the polyethylene glycol) has a molecular weight of about 2000±1100, about 2000±1000, about 2000±900, about 2000±800, about 2000±700, about 2000±600, about 2000±500, about 2000±400, about 2000±300, about 2000±200, about 2000±100, about 2000±50, about 2000±40, about 2000±30, about 2000±20, or about 2000±10 (e.g., about 2000).

In some embodiments, the polyol (e.g., the polyethylene glycol) has a molecular weight of about 1500±700, about 1500±600, about 1500±500, about 1500±400, about 1500±300, about 1500±200, about 1500±100, about 1500±50, about 1500±40, about 1500±30, about 1500±20, or about 1500±10 (e.g., about 1500).

In some embodiments, the polyol (e.g., the polyethylene glycol) has a molecular weight of about 1000±500, about 1000±400, about 1000±300, about 1000±200, about 1000±100, about 1000±50, about 1000±40, about 1000±30, about 1000±20, or about 1000±10 (e.g., about 1000).

In some embodiments, the polyol (e.g., the polyethylene glycol) has a molecular weight of about 600±300, about 600±200, about 600±100, about 600±50, about 600±40, about 600±30, about 600±20, or about 600±10 (e.g., about 600).

In some embodiments, the polyol (e.g., the polyethylene glycol) has a molecular weight of about 400±200, about 400±100, about 400±50, about 400±40, about 400±30, about 400±20, or about 400±10 (e.g., about 400).

In some embodiments, the polyol (e.g., the polyethylene glycol) has a molecular weight of about 300±200, about 300±100, about 300±50, about 300±40, about 300±30, about 300±20, or about 300±10 (e.g., about 300).

In some embodiments, the polyol (e.g., the polyethylene glycol) has a molecular weight of about 200±100, about 200±50, about 200±40, about 200±30, about 200±20, or about 200±10 (e.g., about 200).

In some embodiments, the polyol comprises a polytetrahydrofuran diol, a polytetrahydrofuran triol, or a polytetrahydrofuran tetrol.

In some embodiments, the polyol comprises a polytetrahydrofuran diol.

In some embodiments, the polyol (e.g., the polytetrahydrofuran diol) has a molecular weight (e.g., number average molecular weight ($M_n$)) of about 300 or more, about 400 or more, about 500 or more, about 600 or more, about 700 or more, about 800 or more, about 900 or more, about 1000 or more, about 1100 or more, about 1200 or more, about 1300 or more, about 1400 or more, about 1500 or more, or about 2000 or more.

In some embodiments, the polyol (e.g., the polytetrahydrofuran diol) has a molecular weight (e.g., number average molecular weight ($M_n$)) of about 8000 or less, about 7000 or less, about 6000 or less, about 5000 or less, about 4000 or less, about 3500 or less, about 3400 or less, about 3300 or less, about 3200 or less, about 3100 or less, about 3000 or less, about 2900 or less, about 2800 or less, about 2700 or less, about 2600 or less, about 2500 or less, about 2000 or less, about 1500 or less, about 1000 or less, about 900 or less, about 800 or less, about 700 or less, about 600 or less, about 500 or less, about 400 or less, about 300 or less, or about 200 or less.

In some embodiments, the polyol (e.g., the polytetrahydrofuran diol) has a molecular weight (e.g., number average molecular weight ($M_n$)) of about 2000±1100, about 2000±1000, about 2000±900, about 2000±800, about 2000±700, about 2000±600, about 2000±500, about 2000±400, about 2000±300, about 2000±200, about 2000±100, about 2000±50, about 2000±40, about 2000±30, about 2000±20, or about 2000±10 (e.g., about 2000).

In some embodiments, the polyol (e.g., the polytetrahydrofuran diol) has a molecular weight (e.g., number average molecular weight ($M_n$)) of about 1800±900, about 1800±800, about 1800±700, about 1800±600, about 1800±500, about 1800±400, about 1800±300, about 1800±200, about 1800±100, about 1800±50, about 1800±40, about 1800±30, about 1800±20, or about 1800±10 (e.g., about 1800).

In some embodiments, the polyol (e.g., the polytetrahydrofuran diol) has a molecular weight (e.g., number average molecular weight ($M_n$)) of about 1400±700, about 1400±600, about 1400±500, about 1400±400, about 1400±300, about 1400±200, about 1400±100, about 1400±50, about 1400±40, about 1400±30, about 1400±20, or about 1400±10 (e.g., about 1400).

In some embodiments, the polyol (e.g., the polytetrahydrofuran diol) has a molecular weight (e.g., number average molecular weight ($M_n$)) of about 1000±500, about 1000±400, about 1000±300, about 1000±200, about 1000±100, about 1000±50, about 1000±40, about 1000±30, about 1000±20, or about 1000±10 (e.g., about 1000).

In some embodiments, the polyol (e.g., the polytetrahydrofuran diol) has a molecular weight (e.g., number average molecular weight ($M_n$)) of about 650±300, about 650±200, about 650±100, about 650±50, about 650±40, about 650±30, about 650±20, or about 650±10 (e.g., about 650).

In some embodiments, the polyol (e.g., the polytetrahydrofuran diol) has a molecular weight (e.g., number average molecular weight ($M_n$)) of about 250±100, about 250±50, about 250±40, about 250±30, about 250±20, or about 250±10 (e.g., about 250).

In some embodiments, the polyol is polytetrahydrofuran diol having a number average molecular weight ($M_n$) of about 250.

In some embodiments, the polytetrahydrofuran diol (e.g., having a number average molecular weight ($M_n$) of about 250) is present at a concentration of about 15±10% w/w, 15±5% w/w, 15±4% w/w, 15±3% w/w, 15±2% w/w, or 15±1% w/w (e.g., 15% w/w).

In some embodiments, the polyol comprises a dendritic polyol.

In some embodiments, the polyol comprises a polyester dendritic polyol, a polyether dendritic polyol, a polythioether dendritic polyol, a polyamide dendritic polyol, a polyetherketone dendritic polyol, a polyalkylene imine dendritic polyol, a polyamido amine dendritic polyol, a polyether amide dendritic polyol, a polyarylene dendritic polyol, a polyalkylene dendritic polyol, a aromatic polyalkylene dendritic polyol, a polyaryl acetylene dendritic polyol, a phosphorus- or silicon-containing dendritic polyol, or any combination thereof.

In some embodiments, the polyol comprises a commercially available composition under the trademark Boltorn™.

In some embodiments, the polyol comprises Boltorn™ H2004, Boltorn™ H311, Boltorn™ P1000, Boltorn™ P500, Boltorn™ P501, Boltorn™ U3000, Boltorn™ W3000, Boltorn™ H20, Boltorn™ H2003, Boltorn™ H2004, Boltorn™ H30, Boltorn™ H40, or any combination thereof.

In some embodiments, the polyol comprises a dendritic polyol described in (J. Polymer Science: Part A: Polymer Chemistry, 42:3110-3115 (2004)).

In some embodiments, the polyol comprises a commercially available composition under the trademark Hybrane™.

In some embodiments, the polyol comprises Hybrane™ P1000, Hybrane™ S1200, Hybrane™ H1500, Hybrane™ PS2550, or any combination thereof.

In some embodiments, the polyol (e.g., the diol, triol, tetrol, or dendritic polyol) is present at a concentration of about 60% w/w or less, about 55% w/w or less, about 50% w/w or less, about 45% w/w or less, about 40% w/w or less, about 35% w/w or less, about 30% w/w or less, about 25% w/w or less, about 20% w/w or less, about 15% w/w or less, about 10% w/w or less, about 5% w/w or less, about 4% w/w or less, about 3% w/w or less, about 2% w/w or less, or about 1% w/w or less.

In some embodiments, the polyol (e.g., the diol, triol, tetrol, or dendritic polyol) is present at a concentration of about 1% w/w or more, about 2% w/w or more, about 3% w/w or more, about 4% w/w or more, about 5% w/w or more, about 6% w/w or more, about 7% w/w or more, about 8% w/w or more, about 9% w/w or more, about 10% w/w or more, about 15% w/w or more, about 20% w/w or more.

In some embodiments, the polyol (e.g., the diol, triol, tetrol, or dendritic polyol) is present at a concentration of about 1% w/w, about 2% w/w, about 3% w/w, about 4% w/w, about 5% w/w, about 6% w/w, about 7% w/w, about 8% w/w, about 9% w/w, about 10% w/w, about 11% w/w, about 12% w/w, about 13% w/w, about 14% w/w, about 15% w/w, about 16% w/w, about 17% w/w, about 18% w/w, about 19% w/w, about 20% w/w, about 21% w/w, about 22% w/w, about 23% w/w, about 24% w/w, about 25% w/w, about 26% w/w, about 27% w/w, about 28% w/w, about 29% w/w, about 30% w/w, about 31% w/w, about 32% w/w, about 33% w/w, about 34% w/w, about 35% w/w, about 36% w/w, about 37% w/w, about 38% w/w, about 39% w/w, or about 40% w/w.

In some embodiments, the polyol (e.g., the diol, triol, tetrol, or dendritic polyol) is present at a concentration of about 20±15% w/w, about 20±10% w/w, about 20±9% w/w, about 20±8% w/w, about 20±7% w/w, about 20±6% w/w, about 20±5% w/w, about 20±4% w/w, about 20±3% w/w, about 20±2% w/w, or about 20±1% w/w (e.g., about 20% w/w).

Curing Catalysts

In some embodiments, the curing catalyst is a latent catalyst.

In some embodiments, the latent catalyst is a photo-latent catalyst or a chemically latent catalyst.

In some embodiments, the curing catalyst is activated by irradiation.

In some embodiments, the curing catalyst is activated by UV.

In some embodiments, the curing catalyst is activated by a sensitizer.

In some embodiments, the curing catalyst is a photoinitiator.

In some embodiments, the curing catalyst (e.g., photoinitiator) comprises a cationic photoinitiator, an anionic photoinitiator, or any combination thereof.

In some embodiments, the curing catalyst (e.g., photoinitiator) comprises a cationic photoinitiator.

In some embodiments, the curing catalyst (e.g., photoinitiator) is a precursor of an acid (e.g., a cation).

In some embodiments, upon activation, the curing catalyst (e.g., photoinitiator) is converted to, or releases, an acid (e.g., a cation).

In some embodiments, the curing catalyst (e.g., photoinitiator) is an iodonium catalyst.

In some embodiments, the curing catalyst (e.g., photoinitiator) is a sulfonium catalyst.

In some embodiments, the curing catalyst (e.g., photoinitiator) comprises an organic photoinitiator, an inorganic photoinitiator, or a combination thereof.

In some embodiments, the curing catalyst (e.g., photoinitiator) comprises an organic photoinitiator.

In some embodiments, the curing catalyst (e.g., photoinitiator) comprises an organic cationic photoinitiator.

In some embodiments, the curing catalyst (e.g., photoinitiator) comprises bis(4-tert-butylphenyl) iodonium perfluoro-1-butanesulfonate, bis(4-tert-butylphenyl) iodonium p-toluenesulfonate, bis(4-tert-butylphenyl) iodonium triflate, boc-methoxyphenyldiphenylsulfonium triflate, (4-tert-butylphenyl)diphenylsulfonium triflate, diphenyliodonium hexafluorophosphate, diphenyliodonium nitrate, diphenyliodonium p-toluenesulfonate, diphenyliodonium triflate, (4-fluorophenyl)diphenylsulfonium triflate, n-hydroxynaphthalimide triflate, n-hydroxy-5-norbornene-2,3-dicarboximide perfluoro-1-butanesulfonate, (4-iodophenyl)diphenylsulfonium triflate, (4-methoxyphenyl)diphenylsulfonium triflate, 2-(4-methoxystyryl)-4,6-bis(trichloro-methyl)-1,3,5-triazine, (4-methylthiophenyl)methyl phenyl sulfonium triflate, 1-naphthyl diphenylsulfonium triflate, (4-phenoxyphenyl)diphenylsulfonium triflate, (4-phenylthiophenyl)-diphenylsulfonium triflate, triarylsulfonium hexafluoroantimonate, triarylsulfonium hexafluorophosphate, triphenylsulfonium perfluoro-1-butanesufonate, triphenylsulfonium triflate, tris(4-tert-butylphenyl)sulfonium perfluoro-1-butanesulfonate, tris(4-tert-butylphenyl)sulfonium triflate, or any combination thereof.

In some embodiments, the curing catalyst (e.g., photoinitiator) comprises bis-(4-t-butylphenyl)-iodonium hexafluorophosphate, 4-isopropyl-4'-methyldiphenyliodonium tetrakis(pentafluoro-phenyl)borate, bis(4-dodecylphenyl) iodonium hexafluoroantimonate, (sulfanediyldibenzene-4,1-diyl)bis(diphenylsulfonium)bis(hexafluoroantimonate), (4-{[4-(diphenylsulfanylium)phenyl]-sulfanyl}phenyl)diphenylsulfonium bishexafluorophosphate, 4,4'-dimethyldiphenyl iodonium hexafluorophosphate, or any combination thereof.

In some embodiments, the curing catalyst (e.g., photoinitiator) comprises a commercially available composition under the trademark Irgacure®.

In some embodiments, the curing catalyst (e.g., photoinitiator) comprises Irgacure® 290.

In some embodiments, the curing catalyst (e.g., photoinitiator) comprises Esacure 1187, Omnicat 250, Omnicat 270, Omnicat 320, Omnicat 432, Omnicat 440, Omnicat 445, Omnicat 550, Omnicat BL 550, or any combination thereof.

In some embodiments, the curing catalyst (e.g., photoinitiator) comprises SpeedCure™ 937 (bis(4-dodecylphenyl) iodonium hexafluoroantimonate), SpeedCure™ 938 (bis-(4-t-butylphenyl)-Iodonium hexafluorophosphate), SpeedCure™ 939 (4-isopropyl-4'-methyldiphenyliodonium Tetrakis-(pentafluorophenyl) borate), SpeedCure™ 976 ((sulfanediyldibenzene-4,1-diyl)bis-(diphenylsulfonium) bis(hexafluoroantimonate) in propylene carbonate), SpeedCure™ 976D ((sulfanediyldibenzene-4,1-diyl)bis(diphenylsulfonium) bis(hexafluoroantimonate) in a reactive solvent), SpeedCure 976s ((sulfanediylbenzene-4,1-diyl)bis (diphenylsulfonium) bis-(hexafluoroantimonate)), SpeedCure™ 992 ((4-{[4-(diphenylsulfanylium)phenyl]sulfanyl}-phenyl)diphenylsulfonium bishexafluoro-phosphate in propylene carbonate), or any combination thereof.

In some embodiments, the curing catalyst (e.g., photoinitiator) comprises SpeedCure 992.

In some embodiments, the SpeedCure™ 992 is present at a concentration of about 2±1.5% w/w, about 2±1.4% w/w, about 2±1.3% w/w, about 2±1.2% w/w, about 2±1.0% w/w, about 2±0.9% w/w, about 2±0.8% w/w, about 2±0.7% w/w, about 2±0.6% w/w, about 2±0.5% w/w, about 2±0.4% w/w, about 2±0.3% w/w, about 2±0.2% w/w, or about 2±0.1% w/w (e.g., about 2% w/w).

In some embodiments, the curing catalyst (e.g., photoinitiator) comprises SpeedCure™ 976s.

In some embodiments, the SpeedCure™ 976s is present at a concentration of about 2±1.7% w/w, about 2±1.6% w/w, about 2±1.5% w/w, about 2±1.4% w/w, about 2±1.3% w/w, about 2±1.2% w/w, about 2±1.0% w/w, about 2±0.9% w/w, about 2±0.8% w/w, about 2±0.7% w/w, about 2±0.6% w/w, about 2±0.5% w/w, about 2±0.4% w/w, about 2±0.3% w/w, about 2±0.2% w/w, or about 2±0.1% w/w.

In some embodiments, the curing catalyst (e.g., photoinitiator) is present at a concentration of about 15% w/w or less, about 10% w/w or less, about 9% w/w or less, about 8% w/w or less, about 7% w/w or less, about 5% w/w or less, about 6% w/w or less, about 4% w/w or less, about 3% w/w or less, about 2% w/w or less, about 1% w/w or less, about 0.9% w/w or less, about 0.8% w/w or less, about 0.7% w/w or less, about 0.6% w/w or less, about 0.5% w/w or less, about 0.4% w/w or less, about 0.3% w/w or less, about 0.2% w/w or less, or about 0.1% w/w or less.

In some embodiments, the photoinitiator is present at a concentration of about 0.01% w/w or more, about 0.02% w/w or more, about 0.03% w/w or more, about 0.04% w/w or more, about 0.05% w/w or more, about 0.06% w/w or more, about 0.07% w/w or more, about 0.08% w/w or more, about 0.09% w/w or more, about 0.1% w/w or more, about 0.2% w/w or more, about 0.3% w/w or more, about 0.4% w/w or more, about 0.5% w/w or more, about 1% w/w or more, about 2% w/w or more, about 3% w/w or more, or about 4% w/w or more.

In some embodiments, the curing catalyst (e.g., photoinitiator) is present at a concentration of about 0.01% w/w, about 0.02% w/w, about 0.03% w/w, about 0.04% w/w, about 0.05% w/w, about 0.06% w/w, about 0.07% w/w, about 0.08% w/w, about 0.09% w/w, about 0.1% w/w, about 0.15% w/w, about 0.2% w/w, about 0.25% w/w, about 0.3% w/w, about 0.35% w/w, about 0.4% w/w, about 0.45% w/w, about 0.5% w/w, about 0.6% w/w, about 0.7% w/w, about 0.8% w/w, about 0.9% w/w, about 1% w/w, about 1.5% w/w, about 2% w/w, about 2.5% w/w, about 3% w/w, about 3.5% w/w, about 4% w/w, about 4.5% w/w, about 5% w/w, about 6% w/w, about 7% w/w, about 8% w/w, about 9% w/w, or about 10% w/w.

Sensitizers

In some embodiments, the sensitizer is selected from isopropylthioxanthone (ITX), anthracene, and derivatives thereof.

In some embodiments, the sensitizer comprises isopropylthioxanthone (ITX), e.g., for activating the iodonium catalyst.

In some embodiments, the sensitizer comprises anthracene, e.g., for sensitizing the iodonium or sulfonium catalyst.

In some embodiments, the sensitizer comprises a derivative of anthracene.

In some embodiments, the sensitizer comprises 9,10-diethoxyanthracene, 9,10-dibutoxyanthracene, or a combination thereof.

In some embodiments, the sensitizer comprises 9,10-diethoxyanthracene.

In some embodiments, the sensitizer comprises 9,10-dibutoxyanthracene.

In some embodiments, the sensitizer comprises a commercially available composition under the trademark ANTRACURE®.

In some embodiments, the sensitizer comprises ANTHRACURE® UVS 1101, ANTHRACURE® UVS 1331, or a combination thereof.

In some embodiments, the sensitizer comprises ANTHRACURE® UVS 1101.

In some embodiments, the ANTHRACURE® UVS 1101 is present at a concentration of about 0.27±0.2% w/w, about 0.27±0.15% w/w, about 0.27±0.1% w/w, about 0.27±0.09% w/w, about 0.27±0.08% w/w, about 0.27±0.07% w/w, about 0.27±0.06% w/w, about 0.27±0.05% w/w, about 0.27±0.04% w/w, about 0.27±0.03% w/w, about 0.27±0.02% w/w, or about 0.27±0.01% w/w (e.g., about 0.27% w/w).

In some embodiments, the sensitizer comprises SpeedCure™ 2-ITX (2-Isopropylthioxanthone), SpeedCure™ 7010 (polymeric thioxanthone), SpeedCure™ 7010-L (polymeric thioxanthone and trimethylolpropane ethoxylate triacrylate mixture), SpeedCure™ CPTX (1-chloro-4-propoxythioxanthone), SpeedCure™ DETX (2,4-diethylthioxanthone), SpeedCure™ EAQ (2-ethyl anthraquinone), SpeedCure™ ITX (a mixture of 2-isopropylthioxanthone and 4-isopropylthioxanthone), SpeedCure™ VLT (bis(η5-cyclopentadienyl)-bis(2,6-difluoro-3-[pyrrol-1-yl]-phenyl) titanium), or any combination thereof.

In some embodiments, the sensitizer is present at a concentration of about 5% w/w or less, about 4% w/w or less, about 3% w/w or less, about 2% w/w or less, about 1% w/w or less, about 0.9% w/w or less, about 0.8% w/w or less, about 0.7% w/w or less, about 0.6% w/w or less, about 0.5% w/w or less, about 0.4% w/w or less, about 0.3% w/w or less, about 0.2% w/w or less, about 0.1% w/w or less.

In some embodiments, the sensitizer is present at a concentration of about 0.01% w/w or more, about 0.02% w/w or more, about 0.03% w/w or more, about 0.04% w/w or more, about 0.05% w/w or more, about 0.06% w/w or more, about 0.07% w/w or more, about 0.08% w/w or more, about 0.09% w/w or more, about 0.1% w/w or more, about 0.2% w/w or more, about 0.3% w/w or more, or about 0.4% w/w or more.

In some embodiments, the sensitizer is present at a concentration of about 0.01% w/w, about 0.02% w/w, about 0.03% w/w, about 0.04% w/w, about 0.05% w/w, about 0.06% w/w, about 0.07% w/w, about 0.08% w/w, about 0.09% w/w, about 0.1% w/w, about 0.15% w/w, about 0.2% w/w, about 0.25% w/w, about 0.3% w/w, about 0.35% w/w, about 0.4% w/w, about 0.45% w/w, or about 0.5% w/w.

Toughening Agents

In some embodiments, the combination, material, or kit further comprises a toughening agent.

In some embodiments, the toughening agent comprises a polymer.

In some embodiments, the toughening agent comprises a monomer.

In some embodiments, the toughening agent comprises a crosslinking agent.

In some embodiments, the toughening agent comprises a prepolymer.

In some embodiments, the toughening agent comprises a homopolymer, a copolymer, or a combination thereof.

In some embodiments, the toughening agent comprises a homopolymer.

In some embodiments, the toughening agent comprises a butadiene homopolymer.

In some embodiments, the toughening agent comprises a copolymer.

In some embodiments, the toughening agent comprises a butadiene-acrylonitrile copolymer.

In some embodiments, the toughening agent comprises a commercially available composition under the trademark Hypro®.

In some embodiments, the toughening agent comprises Hypro® 1300X68 ETBN, Hypro® 2000X174 ETB, Hypro® 1300X40 ETBN, Hypro® 1300X63 ETBN, Hypro® 1300X33LC VTBNX, Hypro® 1300X43LC VTBNX, Hypro® 2000X168LC VTB, Hypro® 1300X16 ATBN, Hypro® 1300X21 ATBN, Hypro® 1300X35 ATBN, Hypro® 1300X42 ATBN, Hypro® 1300X45 ATBN, Hypro® 1300X8 CTBN, Hypro® 1300X08F CTBN, Hypro® 1300X9 CTBNX, Hypro® 1300X13 CTBN, Hypro® 1300X13CL CTBN, Hypro® 1300X13F CTBN, Hypro® 1300X13NA CTBN, Hypro® 1300X18 CTBNX, Hypro® 1300X31 CTBN, Hypro® 1300X47 CTBN, Hypro® 2000X162 CTB, Hypro® 2000X172 CTB, or any combination thereof.

In some embodiments, the toughening agent comprises Hypro® 1300X68 ETBN, Hypro® 2000X174 ETB, Hypro® 1300X40 ETBN, Hypro® 1300X63 ETBN, or any combination thereof.

In some embodiments, the toughening agent comprises a commercially available composition under the trademark B-Tough™.

In some embodiments, the toughening agent comprises B-Tough™ A1, B-Tough™ A2, B-Tough™ A3, B-Tough™ C2r, B-Tough™ C2x, or any combination thereof.

In some embodiments, the toughening agent comprises a commercially available composition under the trademark Trixene®.

In some embodiments, the toughening agent comprises Trixene® BI 7770, Trixene® BI 7771, Trixene® BI 7772, Trixene® BI 7774, Trixene® BI 7779, or any combination thereof.

In some embodiments, the toughening agent comprises a commercially available composition under the trademark Curalite™.

In some embodiments, the toughening agent comprises Curalite™ Ox, Curalite™ OxPlus, Curalite™ Pro Ox C20, Curalite™ Pro Ox C50, or a combination thereof.

In some embodiments, the toughening agent comprises Curalite™ Ox, Curalite™ OxPlus, or a combination thereof.

In some embodiments, the toughening agent comprises Curalite™ Ox.

In some embodiments, the toughening agent comprises Curalite™ OxPlus.

In some embodiments, the Curalite™ Ox is present at a concentration of about 20±10% w/w, about 20±9% w/w, about 20±8% w/w, about 20±7% w/w, about 20±6% w/w, about 20±5% w/w, about 20±4% w/w, about 20±3% w/w, about 20±2% w/w, or about 20±1% w/w (e.g., about 20% w/w).

In some embodiments, the Curalite™ OxPlus is present at a concentration of about 7.5±4% w/w, about 7.5±3% w/w, about 7.5±2% w/w, about 7.5±1% w/w, about 7.5±0.9% w/w, about 7.5±0.8% w/w, about 7.5±0.7% w/w, about 7.5±0.6% w/w, about 7.5±0.7.5% w/w, about 7.5±0.4% w/w, about 7.5±0.3% w/w, about 7.5±0.2% w/w, or about 7.5±0.1% w/w (e.g., about 7.5% w/w).

In some embodiments, the Curalite™ OxPlus is present at a concentration of about 5±4% w/w, about 5±3% w/w, about 5±2% w/w, about 5±1% w/w, about 5±0.9% w/w, about 5±0.8% w/w, about 5±0.7% w/w, about 5±0.6% w/w, about 5±0.5% w/w, about 5±0.4% w/w, about 5±0.3% w/w, about 5±0.2% w/w, or about 5±0.1% w/w (e.g., about 5% w/w).

In some embodiments, the toughening agent comprises particles (e.g., core-shell particles).

In some embodiments, the particles (e.g., core-shell particles) comprises MZ-120, SX-005, or a combination thereof.

In some embodiments, the combination, material, or kit comprises a mixture of particles (e.g., core-shell particles) and the polyol.

In some embodiments, the combination, material, or kit comprises Kane Ace® MX-710, Kane Ace® MX-714, or a combination thereof.

In some embodiments, the combination, material, or kit comprises a mixture of particles (e.g., core-shell particles) and the ring-containing agent (e.g., 7-oxabicyclo[4.1.0]hept-3-ylmethyl).

In some embodiments, the combination, material, or kit comprises a mixture of particles (e.g., core-shell particles) and 7-oxabicyclo[4.1.0]hept-3-ylmethyl.

In some embodiments, the mixture comprises about 15% w/w, about 20% w/w, about 25% w/w, about 30% w/w, about 31% w/w, about 32% w/w, about 33% w/w, about 34% w/w, about 35% w/w, about 40% w/w, about 45% w/w, or about 50% w/w of particles (e.g., core-shell particles).

In some embodiments, the mixture comprises about 30% w/w of the particles (e.g., core-shell particles).

In some embodiments, the combination, material, or kit comprises Kane Ace® MX-962, Kane AceR MX-125, Kane Ace® MX-156, Kane AceR MX-965, Kane Ace® MX-136, Kane Ace® MX-550, Kane AceR MX-551, Kane Ace® MX-553, or any combination thereof.

In some embodiments, the combination, material, or kit comprises Kane AceR MX-553.

In some embodiments, the combination, material, or kit comprises METABLEN™ S-2501, METABLEN™ SX-005, METABLEN™ C-223S, METABLEN™ E-870A, METABLEN™ E875A, METABLEN™ W-300A, METABLEN™ W450A, METABLEN™ W-600A, or any combination thereof.

In some embodiments, the Kane Ace® MX-553 is present at a concentration of about 70±35% w/w, about 70±30% w/w, about 70±25% w/w, about 70±20% w/w, about 70±15% w/w, about 70±10% w/w, about 70±9% w/w, about 70±8% w/w, about 70±7% w/w, about 70±6% w/w, about 70±5% w/w, about 70±4% w/w, about 70±3% w/w, about 70±2% w/w, or about 70±1% w/w (e.g., about 70% w/w).

In some embodiments, the Kane Ace® MX-553 is present at a concentration of about 65±35% w/w, about 65±30% w/w, about 65±25% w/w, about 65±20% w/w, about 65±15% w/w, about 65±10% w/w, about 65±9% w/w, about 65±8% w/w, about 65±7% w/w, about 65±6% w/w, about 65±5% w/w, about 65±4% w/w, about 65±3% w/w, about 65±2% w/w, or about 65±1% w/w (e.g., about 65% w/w).

In some embodiments, the Kane AceR MX-553 is present at a concentration of about 55±35% w/w, about 55±30% w/w, about 55±25% w/w, about 55±20% w/w, about 55±15% w/w, about 55±10% w/w, about 55±9% w/w, about 55±8% w/w, about 55±7% w/w, about 55±6% w/w, about 55±5% w/w, about 55±4% w/w, about 55±3% w/w, about 55±2% w/w, or about 55±1% w/w (e.g., about 55% w/w).

In some embodiments, the toughening agent (e.g., the monomer, crosslinking agent, prepolymer, homopolymer, or copolymer) is present at a concentration of about 1% w/w or more, about 2% w/w or more, about 3% w/w or more, about 4% w/w or more, about 5% w/w or more, about 6% w/w or more, about 7% w/w or more, about 8% w/w or more, about 9% w/w or more, about 10% w/w or more, about 15% w/w or more, about 20% w/w or more, about 25% w/w or more, about 30% w/w or more, about 35% w/w or more, about 40% w/w or more, about 45% w/w or more, or about 50% w/w or more.

In some embodiments, the toughening agent (e.g., the monomer, crosslinking agent, prepolymer, homopolymer, or copolymer) is present at a concentration of about 80% w/w or less, about 70% w/w or less, about 60% w/w or less, about 50% w/w or less, about 45% w/w or less, about 40% w/w or less, about 35% w/w or less, about 30% w/w or less, about 25% w/w or less, about 20% w/w or less, about 15% w/w or less, about 10% w/w or less, about 9% w/w or less, about 8% w/w or less, about 7% w/w or less, about 6% w/w or less, or about 5% w/w or less.

In some embodiments, the toughening agent (e.g., the monomer, crosslinking agent, prepolymer, homopolymer, or copolymer) is present at a concentration of about 20±10% w/w, about 20±9% w/w, about 20±8% w/w, about 20±7% w/w, about 20±6% w/w, about 20±5% w/w, about 20±4% w/w, about 20±3% w/w, about 20±2% w/w, or about 20±1% w/w (e.g., about 20% w/w).

In some embodiments, the toughening agent (e.g., the monomer, crosslinking agent, prepolymer, homopolymer, or copolymer) is present at a concentration of about 15±10% w/w, about 15±9% w/w, about 15±8% w/w, about 15±7% w/w, about 15±6% w/w, about 15±5% w/w, about 15±4% w/w, about 15±3% w/w, about 15±2% w/w, or about 15±1% w/w (e.g., about 15% w/w).

In some embodiments, the toughening agent (e.g., the monomer, crosslinking agent, prepolymer, homopolymer, or copolymer) is present at a concentration of about 10±5% w/w, about 10±4% w/w, about 10±3% w/w, about 10±2% w/w, or about 10±1% w/w (e.g., about 10% w/w).

In some embodiments, the toughening agent comprises a block copolymer.

In some embodiments, the toughening agent comprises a di-block copolymer, a tri-block copolymer, or a combination thereof.

In some embodiments, the toughening agent comprises a di-block copolymer.

In some embodiments, the toughening agent comprises a tri-block copolymer.

In some embodiments, the toughening agent (e.g., the block copolymer) is present at a concentration of about 25% w/w or less, about 20% w/w or less, about 15% w/w or less, about 10% w/w or less, about 9% w/w or less, about 8% w/w or less, about 7% w/w or less, about 6% w/w or less, or about 5% w/w or less.

In some embodiments, the toughening agent (e.g., the block copolymer) is present at a concentration of about 1% w/w or more, about 2% w/w or more, about 3% w/w or more, about 4% w/w or more, about 5% w/w or more, about 6% w/w or more, about 7% w/w or more, about 8% w/w or more, about 9% w/w or more, about 10% w/w or more, about 15% w/w or more, or about 20% w/w or more.

In some embodiments, the toughening agent (e.g., the block copolymer) is present at a concentration of about 10±5% w/w, about 10±4% w/w, about 10±3% w/w, about 10±2% w/w, or about 10±1% w/w (e.g., about 10% w/w).

In some embodiments, the toughening agent (e.g., the block copolymer) is present at a concentration of about 5±4% w/w, about 5±3% w/w, about 5±2% w/w, about 5±1% w/w, about 5±0.9% w/w, about 5±0.8% w/w, about 5±0.7% w/w, about 5±0.6% w/w, about 5±0.5% w/w, about 5±0.4% w/w, about 5±0.3% w/w, about 5±0.2% w/w, about 5±0.1% w/w (e.g., about 5% w/w).

Stabilizers

In some embodiments, the combination, material, or kit further comprises a stabilizer.

In some embodiments, the stabilizer comprises a tertiary-amine compound.

In some embodiments, the tertiary-amine compound is methyl diethanolamine, ethyl diethanolamine, propyl diethanolamine, butyl diethanolamine, methyl dipropanolamine, ethyl dipropanolamine, propyl dipropanolamine, butyl dipropanolamine, or any combination thereof.

In some embodiments, the tertiary-amine compound is methyl diethanolamine.

In some embodiments, the tertiary-amine compound is ethyl diethanolamine.

In some embodiments, the tertiary-amine compound is propyl diethanolamine.

In some embodiments, the tertiary-amine compound is butyl diethanolamine.

In some embodiments, the tertiary-amine compound is methyl dipropanolamine.

In some embodiments, the tertiary-amine compound is ethyl dipropanolamine.

In some embodiments, the tertiary-amine compound is propyl dipropanolamine.

In some embodiments, the tertiary-amine compound is butyl dipropanolamine.

In some embodiments, the stabilizer comprises a sulfide compound.

In some embodiments, the sulfide compound is a dialkyl sulfide, diaryl sulfide, or alkylaryl sulfide.

In some embodiments, the sulfide is dodecyl sulfide or diphenyl sulfide.

Additional suitable stabilizers are described, e.g., in U.S. Pat. No. 7,845,785 (incorporated by reference).

In some embodiments, the stabilizer is present at a concentration of about 5% w/w or less, about 4% w/w or less, about 3% w/w or less, about 2% w/w or less, about 1% w/w or less, about 0.9% w/w or less, about 0.8% w/w or less, about 0.7% w/w or less, about 0.6% w/w or less, about 0.5% w/w or less, about 0.4% w/w or less, about 0.3% w/w or less, about 0.2% w/w or less, about 0.1% w/w or less.

In some embodiments, the stabilizer is present at a concentration of about 0.01% w/w or more, about 0.02% w/w or more, about 0.03% w/w or more, about 0.04% w/w or more, about 0.05% w/w or more, about 0.06% w/w or more, about 0.07% w/w or more, about 0.08% w/w or more, about 0.09% w/w or more, about 0.1% w/w or more, about 0.2% w/w or more, about 0.3% w/w or more, or about 0.4% w/w or more.

In some embodiments, the stabilizer is present at a concentration of about 0.01% w/w, about 0.02% w/w, about 0.03% w/w, about 0.04% w/w, about 0.05% w/w, about 0.06% w/w, about 0.07% w/w, about 0.08% w/w, about 0.09% w/w, about 0.1% w/w, about 0.15% w/w, about 0.2% w/w, about 0.25% w/w, about 0.3% w/w, about 0.35% w/w, about 0.4% w/w, about 0.45% w/w, or about 0.5% w/w.

Surface Tension Modifiers

In some embodiments, the combination, material, or kit further comprises a surface tension modifier.

In some embodiments, the surface tension modifier is also a ring-containing agent.

In some embodiments, the surface tension modifier comprises sorbitol polyglycidyl ether, ethylene glycol digylcidyl ether, neopentyl glycol diglycidyl ether, 1,4-butanediol diglycidyl ether, cyclohexanedimethanol diglycidyl ether, polypropylene glycol diglycidyl ether, 1,6-hexanediol diglycidyl ether, diglycidyl ether of brominated neopentyl glycol, trimethylolpropane triglycidyl ether, trimethylolethane triglycidyl ether, castor oil triglycidyl ether, castor oil glycidyl ether, propoxylated glycerin triglycidyl ether, polyglycerol-3-polyglycidyl ether, epoxidized pentaerythritol, epoxidized cyclohexanedimethanol, or any combination thereof.

In some embodiments, the surface tension modifier comprises epoxidized meta-xylylenediamine.

In some embodiments, the surface tension modifier comprises glycidyl ester of neodecanoic acid, glycidyl ester of dimer acid, or a combination thereof.

In some embodiments, the surface tension modifier comprises n-butyl glycidyl ether, 2-ethylhexyl glycidyl ethe, $C_8$-$C_{10}$ aliphatic glycidyl ether, $C_{12}$-$C_{14}$ aliphatic glycidyl ether, or any combination thereof.

In some embodiments, the surface tension modifier comprises o-cresyl glycidyl ether, p-tertiary butyl phenyl glycidyl ether, phenyl glycidyl ether, or any combination thereof.

In some embodiments, the surface tension modifier comprises a commercially available composition under the trademark Silmer®.

In some embodiments, the surface tension modifier comprises Silmer® EPC C50, Silmer® EPC F418-F, Silmer® EP D208, Silmer® EPC Di-50, or any combination thereof.

In some embodiments, the surface tension modifier comprises Silmer® EPC F418-F.

In some embodiments, the Silmer® EPC F418-F is present at a concentration of about 0.05±0.03% w/w, about 0.05±0.02% w/w, about 0.05±0.01% w/w, about 0.05±0.005% w/w, about 0.05±0.004% w/w, about 0.05±0.003% w/w, about 0.05±0.002% w/w, or about 0.05±0.001% w/w (e.g., about 0.05% w/w).

Colorants

In some embodiments, the combination, material, or kit further comprises a colorant.

In some embodiments, the colorant comprises a pigment, a dye, or a combination thereof.

In some embodiments, the colorant comprises a pigment.

In some embodiments, the pigment is an organic pigment, an inorganic pigment, or a combination thereof.

In some embodiments, the colorant comprises a dye.

In some embodiments, the dye is an organic dye, an inorganic dye, or a combination thereof.

Without wishing to be bound by theory, it is noted that the pigment or dye may enable the optical sensing (e.g., scanning) of the deposited material during printing. In some embodiments, the combination or build material containing the pigment or dye is colored, thereby enabling the optical sensing (e.g., scanning) of the deposited material by its color. In some embodiments, the combination or build material containing the pigment or dye is colorless but fluorescent, thereby enabling the optical sensing (e.g., scanning) of the deposited material by its fluorescence.

Exemplary Embodiments of the Materials

In some embodiments, the ring-containing agent comprises ERISYS® GE-13, UviCure™ S105, EPALLOY® 8220, or any combination thereof; the polyol comprises polycaprolactone diol, Capa® 2043, Capa® 3031, Capromer™ PD4-05, polytetrahydrofuran diol, or any combination thereof; the toughening agent comprises Curalite™ Ox, Curalite™ OxPlus, Kane Ace® MX-553, or any combination thereof; the surface tension modifier comprises Silmer® EPC F418-F; the curing catalyst comprises SpeedCure™ 992; and the sensitizer comprises ANTHRACURE® UVS 1101.

In some embodiments, the ring-containing agent comprises UviCure™ S105 and EPALLOY® 8220; the polyol comprises polytetrahydrofuran diol; the toughening agent comprises Curalite™ Ox; the surface tension modifier comprises Silmer® EPC F418-F; the curing catalyst comprises SpeedCure™ 992; and the sensitizer comprises ANTHRACURE® UVS 1101.

In some embodiments, the ring-containing agent comprises UviCure™ S105 present at a concentration of about 50±30% w/w, about 50±20% w/w, about 50±10% w/w, about 50±5% w/w, about 50±4% w/w, about 50±3% w/w, about 50±2% w/w, or about 50±1% w/w, and EPALLOY® 8220 present at a concentration of about 15±10% w/w, about 15±5% w/w, about 15±4% w/w, about 15±3% w/w, about 15±2% w/w, or about 15±1% w/w; the polyol comprises polytetrahydrofuran diol present at a concentration of about 15±10% w/w, about 15±5% w/w, about 15±4% w/w, about 15±3% w/w, about 15±2% w/w, or about 15±1% w/w; the toughening agent comprises Curalite™ Ox present at a concentration of about 20±10% w/w, about 20±9% w/w, about 20±8% w/w, about 20±7% w/w, about 20±6% w/w, about 20±5% w/w, about 20±4% w/w, about 20±3% w/w, about 20±2% w/w, or about 20±1% w/w; the surface tension modifier comprises Silmer® EPC F418-F present at a concentration of about 0.05±0.03% w/w, about 0.05±0.02% w/w, about 0.05±0.01% w/w, about 0.05±0.005% w/w, about 0.05±0.004% w/w, about 0.05±0.003% w/w, about 0.05±0.002% w/w, or about 0.05±0.001% w/w; the curing catalyst comprises SpeedCure™ 992 present at a concentration of about 2±1.5% w/w, about 2±1.4% w/w, about 2±1.3% w/w, about 2±1.2% w/w, about 2±1.0% w/w, about 2±0.9% w/w, about 2±0.8% w/w, about 2±0.7% w/w, about 2±0.6% w/w, about 2±0.5% w/w, about 2±0.4% w/w, about 2±0.3% w/w, about 2±0.2% w/w, or about 2±0.1% w/w; and the sensitizer comprises ANTHRACURE® UVS 1101 present at a concentration of about 0.27±0.2% w/w, about 0.27±0.15% w/w, about 0.27±0.1% w/w, about 0.27±0.09% w/w, about 0.27±0.08% w/w, about 0.27±0.07% w/w, about 0.27±0.06% w/w, about 0.27±0.05% w/w, about 0.27±0.04% w/w, about 0.27±0.03% w/w, about 0.27±0.02% w/w, or about 0.27±0.01% w/w.

Properties of the Materials

In some embodiments, the material has a viscosity of about 5 cp or greater, about 6 cp or greater, about 7 cp or greater, about 8 cp or greater, about 9 cp or greater, about 10 cp or greater, about 11 cp or greater, about 12 cp or greater, about 13 cp or greater, about 14 cp or greater, about 15 cp or greater, about 20 cp or greater, about 25 cp or greater, about 30 cp or greater, about 35 cp or greater, about 40 cp or greater, about 45 cp or greater, about 50 cp or greater, about 60 cp or greater, about 70 cp or greater, about 80 cp or greater, or about 90 cp or greater, as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a viscosity of about 150 cp or less, about 140 cp or less, about 130 cp or less, about 120 cp or less, about 110 cp or less, about 100 cp or less, about 90 cp or less, about 80 cp or less, about 70 cp or less, about 60 cp or less, about 50 cp or less, about 40 cp or less, about 30 cp or less, about 20 cp or less, or about 15 cp or less, as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a viscosity of about 120 cp or less, about 110 cp or less, about 100 cp or less, about 90 cp or less, about 80 cp or less, about 70 cp or less, about 60 cp or less, about 50 cp or less, about 40 cp or less, about 30 cp or less, about 20 cp or less, or about 15 cp or less, as measured at a temperature of about 70° C.

In some embodiments, the material has a viscosity ranging from about 10 cp to about 15 cp as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a viscosity ranging from about 10 cp to about 15 cp as measured at a temperature of about 20° C.

In some embodiments, the material has a viscosity ranging from about 10 cp to about 15 cp as measured at a temperature of about 25° C.

In some embodiments, the material has a viscosity ranging from about 10 cp to about 15 cp as measured at a temperature of about 30° C.

In some embodiments, the material has a viscosity ranging from about 10 cp to about 15 cp as measured at a temperature of about 35° C.

In some embodiments, the material has a viscosity ranging from about 10 cp to about 15 cp as measured at a temperature of about 40° C.

In some embodiments, the material has a viscosity ranging from about 10 cp to about 15 cp as measured at a temperature of about 45° C.

In some embodiments, the material has a viscosity ranging from about 10 cp to about 15 cp as measured at a temperature of about 50° C.

In some embodiments, the material has a viscosity ranging from about 10 cp to about 15 cp as measured at a temperature of about 55° C.

In some embodiments, the material has a viscosity ranging from about 10 cp to about 15 cp as measured at a temperature of about 60° C.

In some embodiments, the material has a viscosity ranging from about 10 cp to about 15 cp as measured at a temperature of about 65° C.

In some embodiments, the material has a viscosity ranging from about 10 cp to about 15 cp as measured at a temperature of about 70° C.

In some embodiments, the material has a viscosity ranging from about 10 cp to about 15 cp as measured at a temperature of about 75° C.

In some embodiments, the material has a viscosity ranging from about 10 cp to about 15 cp as measured at a temperature of about 80° C.

In some embodiments, the material has a viscosity ranging from about 10 cp to about 15 cp as measured at a temperature of about 85° C.

In some embodiments, the material has a viscosity ranging from about 10 cp to about 15 cp as measured at a temperature of about 90° C.

In some embodiments, the material has a viscosity ranging from about 10 cp to about 15 cp as measured at a temperature of about 95° C.

In some embodiments, the material has a viscosity ranging from about 10 cp to about 15 cp as measured at a temperature of about 100° C.

In some embodiments, the material has a viscosity ranging from about 10 cp to about 15 cp as measured at a temperature of about 110° C.

In some embodiments, the material has a viscosity ranging from about 10 cp to about 15 cp as measured at a temperature of about 120° C.

In some embodiments, the material has a viscosity ranging from about 10 cp to about 15 cp as measured at a temperature of about 130° C.

In some embodiments, the material has a viscosity ranging from about 10 cp to about 15 cp as measured at a temperature of about 140° C.

In some embodiments, the material has a viscosity ranging from about 10 cp to about 15 cp as measured at a temperature of about 150° C.

In some embodiments, the material has a viscosity of about 100 cp or less as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a viscosity of about 100 cp or less as measured at a temperature of about 20° C.

In some embodiments, the material has a viscosity of about 100 cp or less as measured at a temperature of about 25° C.

In some embodiments, the material has a viscosity of about 100 cp or less as measured at a temperature of about 30° C.

In some embodiments, the material has a viscosity of about 100 cp or less as measured at a temperature of about 35° C.

In some embodiments, the material has a viscosity of about 100 cp or less as measured at a temperature of about 40° C.

In some embodiments, the material has a viscosity of about 100 cp or less as measured at a temperature of about 45° C.

In some embodiments, the material has a viscosity of about 100 cp or less as measured at a temperature of about 50° C.

In some embodiments, the material has a viscosity of about 100 cp or less as measured at a temperature of about 55° C.

In some embodiments, the material has a viscosity of about 100 cp or less as measured at a temperature of about 60° C.

In some embodiments, the material has a viscosity of about 100 cp or less as measured at a temperature of about 65° C.

In some embodiments, the material has a viscosity of about 100 cp or less as measured at a temperature of about 70° C.

In some embodiments, the material has a viscosity of about 100 cp or less as measured at a temperature of about 75° C.

In some embodiments, the material has a viscosity of about 100 cp or less as measured at a temperature of about 80° C.

In some embodiments, the material has a viscosity of about 100 cp or less as measured at a temperature of about 85° C.

In some embodiments, the material has a viscosity of about 100 cp or less as measured at a temperature of about 90° C.

In some embodiments, the material has a viscosity of about 100 cp or less as measured at a temperature of about 95° C.

In some embodiments, the material has a viscosity of about 100 cp or less as measured at a temperature of about 100° C.

In some embodiments, the material has a viscosity of about 100 cp or less as measured at a temperature of about 110° C.

In some embodiments, the material has a viscosity of about 100 cp or less as measured at a temperature of about 120° C.

In some embodiments, the material has a viscosity of about 100 cp or less as measured at a temperature of about 130° C.

In some embodiments, the material has a viscosity of about 100 cp or less as measured at a temperature of about 140° C.

In some embodiments, the material has a viscosity of about 100 cp or less as measured at a temperature of about 150° C.

In some embodiments, the material has a viscosity ranging from about 60 cp to about 100 cp as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a viscosity ranging from about 60 cp to about 100 cp as measured at a temperature of about 20° C.

In some embodiments, the material has a viscosity ranging from about 60 cp to about 100 cp as measured at a temperature of about 25° C.

In some embodiments, the material has a viscosity ranging from about 60 cp to about 100 cp as measured at a temperature of about 30° C.

In some embodiments, the material has a viscosity ranging from about 60 cp to about 100 cp as measured at a temperature of about 35° C.

In some embodiments, the material has a viscosity ranging from about 60 cp to about 100 cp as measured at a temperature of about 40° C.

In some embodiments, the material has a viscosity ranging from about 60 cp to about 100 cp as measured at a temperature of about 45° C.

In some embodiments, the material has a viscosity ranging from about 60 cp to about 100 cp as measured at a temperature of about 50° C.

In some embodiments, the material has a viscosity ranging from about 60 cp to about 100 cp as measured at a temperature of about 55° C.

In some embodiments, the material has a viscosity ranging from about 60 cp to about 100 cp as measured at a temperature of about 60° C.

In some embodiments, the material has a viscosity ranging from about 60 cp to about 100 cp as measured at a temperature of about 65° C.

In some embodiments, the material has a viscosity ranging from about 60 cp to about 100 cp as measured at a temperature of about 70° C.

In some embodiments, the material has a viscosity ranging from about 60 cp to about 100 cp as measured at a temperature of about 75° C.

In some embodiments, the material has a viscosity ranging from about 60 cp to about 100 cp as measured at a temperature of about 80° C.

In some embodiments, the material has a viscosity ranging from about 60 cp to about 100 cp as measured at a temperature of about 85° C.

In some embodiments, the material has a viscosity ranging from about 60 cp to about 100 cp as measured at a temperature of about 90° C.

In some embodiments, the material has a viscosity ranging from about 60 cp to about 100 cp as measured at a temperature of about 95° C.

In some embodiments, the material has a viscosity ranging from about 60 cp to about 100 cp as measured at a temperature of about 100° C.

In some embodiments, the material has a viscosity ranging from about 60 cp to about 100 cp as measured at a temperature of about 110° C.

In some embodiments, the material has a viscosity ranging from about 60 cp to about 100 cp as measured at a temperature of about 120° C.

In some embodiments, the material has a viscosity ranging from about 60 cp to about 100 cp as measured at a temperature of about 130° C.

In some embodiments, the material has a viscosity ranging from about 60 cp to about 100 cp as measured at a temperature of about 140° C.

In some embodiments, the material has a viscosity ranging from about 60 cp to about 100 cp as measured at a temperature of about 150° C.

In some embodiments, the material has a surface tension of about 5 mN/m or greater, about 6 mN/m or greater, about 7 mN/m or greater, about 8 mN/m or greater, about 9 mN/m or greater, about 10 mN/m or greater, about 12 mN/m or greater, about 14 mN/m or greater, about 16 mN/m or greater, about 18 mN/m or greater, about 20 mN/m or greater, or about 25 mN/m or greater, as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a surface tension of about 50 mN/m or less, about 45 mN/m or less, about 40 mN/m or less, about 39 mN/m or less, about 38 mN/m or less, about 37 mN/m or less, about 36 mN/m or less, about 35 mN/m or less, about 34 mN/m or less, about 33 mN/m or less, about 32 mN/m or less, about 31 mN/m or less, or about 30 mN/m or less, as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a surface tension ranging from about 20 mN/m to about 35 mN/m as measured at a temperature of about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 110° C., about 120° C., about 130° C., about 140° C., or about 150° C.

In some embodiments, the material has a surface tension ranging from about 20 mN/m to about 35 mN/m as measured at a temperature of about 20° C.

In some embodiments, the material has a surface tension ranging from about 20 mN/m to about 35 mN/m as measured at a temperature of about 25° C.

In some embodiments, the material has a surface tension ranging from about 20 mN/m to about 35 mN/m as measured at a temperature of about 30° C.

In some embodiments, the material has a surface tension ranging from about 20 mN/m to about 35 mN/m as measured at a temperature of about 35° C.

In some embodiments, the material has a surface tension ranging from about 20 mN/m to about 35 mN/m as measured at a temperature of about 40° C.

In some embodiments, the material has a surface tension ranging from about 20 mN/m to about 35 mN/m as measured at a temperature of about 45° C.

In some embodiments, the material has a surface tension ranging from about 20 mN/m to about 35 mN/m as measured at a temperature of about 50° C.

In some embodiments, the material has a surface tension ranging from about 20 mN/m to about 35 mN/m as measured at a temperature of about 55° C.

In some embodiments, the material has a surface tension ranging from about 20 mN/m to about 35 mN/m as measured at a temperature of about 60° C.

In some embodiments, the material has a surface tension ranging from about 20 mN/m to about 35 mN/m as measured at a temperature of about 65° C.

In some embodiments, the material has a surface tension ranging from about 20 mN/m to about 35 mN/m as measured at a temperature of about 70° C.

In some embodiments, the material has a surface tension ranging from about 20 mN/m to about 35 mN/m as measured at a temperature of about 75° C.

In some embodiments, the material has a surface tension ranging from about 20 mN/m to about 35 mN/m as measured at a temperature of about 80° C.

In some embodiments, the material has a surface tension ranging from about 20 mN/m to about 35 mN/m as measured at a temperature of about 85° C.

In some embodiments, the material has a surface tension ranging from about 20 mN/m to about 35 mN/m as measured at a temperature of about 90° C.

In some embodiments, the material has a surface tension ranging from about 20 mN/m to about 35 mN/m as measured at a temperature of about 95° C.

In some embodiments, the material has a surface tension ranging from about 20 mN/m to about 35 mN/m as measured at a temperature of about 100° C.

In some embodiments, the material has a surface tension ranging from about 20 mN/m to about 35 mN/m as measured at a temperature of about 110° C.

In some embodiments, the material has a surface tension ranging from about 20 mN/m to about 35 mN/m as measured at a temperature of about 120° C.

In some embodiments, the material has a surface tension ranging from about 20 mN/m to about 35 mN/m as measured at a temperature of about 130° C.

In some embodiments, the material has a surface tension ranging from about 20 mN/m to about 35 mN/m as measured at a temperature of about 140° C.

In some embodiments, the material has a surface tension ranging from about 20 mN/m to about 35 mN/m as measured at a temperature of about 150° C.

Curing of Build Materials

In some embodiments, the build material is deposited (e.g., jetted) under a build depositing condition (e.g., build jetting condition).

In some embodiments, the build material is cured under a build curing condition.

In some embodiments, the build material is a liquid under the build depositing condition (e.g., the build jetting condition).

In some embodiments, the build material is a wax.

In some embodiments, the build material has a melting point being the same or lower than the temperature of the build depositing condition.

In some embodiments, upon deposition, the build material is converted to a solid (e.g., via a phase change).

In some embodiments, upon deposition, the build material is converted to a solid by curing.

In some embodiments, upon deposition, the build material is converted to a solid by curing.

In some embodiments, the build material is UV curable.

In some embodiments, the build material is substantially stable (e.g., chemically and/or physically) toward the support material.

In some embodiments, the build material is substantially stable (e.g., chemically and/or physically) under the support curing condition.

In some embodiments, the build material is substantially stable (e.g., chemically and/or physically) toward the cured support material.

In some embodiments, upon activation, the curing catalyst cures the build material but does not cure the support material.

In some embodiments, the build curing condition comprises radiation.

In some embodiments, the radiation is a light.

In some embodiments, the radiation is UV or visible light.

In some embodiments, the radiation is UV.

In some embodiments, the radiation is visible light.

In some embodiments, the curing condition further comprises an elevated temperature.

In some embodiments, the elevated temperature is about 30° C. or higher, about 35° C. or higher, about 40° C. or higher, about 45° C. or higher, about 50° C. or higher, about 55° C. or higher, about 60° C. or higher, about 65° C. or higher, about 70° C. or higher, about 75° C. or higher, about 80° C. or higher, about 85° C. or higher, about 90° C. or higher, about 95° C. or higher, about 100° C. or higher, about 110° C. or higher, about 120° C. or higher, about 130° C. or higher, about 140° C. or higher, about 150° C. or higher, about 160° C. or higher, about 170° C. or higher, about 180° C. or higher, about 190° C. or higher, about 200° C. or higher, about 250° C. or higher, about 300° C. or higher, about 350° C. or higher, about 400° C. or higher, about 450° C. or higher, or about 500° C. or higher.

In some embodiments, the elevated temperature is about 500° C. or lower, about 450° C. or lower, about 400° C. or lower, about 350° C. or lower, about 300° C. or lower, about 250° C. or lower, about 200° C. or lower, about 190° C. or lower, about 180° C. or lower, about 170° C. or lower, about 160° C. or lower, about 150° C. or lower, about 140° C. or lower, about 130° C. or lower, about 120° C. or lower, about 110° C. or lower, about 100° C. or lower, about 90° C. or lower, about 80° C. or lower, about 70° C. or lower, about 60° C. or lower, or about 50° C. or lower.

In some embodiments, the build curing condition is substantially free of air (e.g., oxygen).

In some embodiments, the build curing condition is substantially free of water.

In some embodiments, the cured build material is substantially stable (e.g., chemically and/or physically) toward the cured support material In some embodiments, the cured build material is substantially stable (e.g., chemically and/or physically) under the support removal condition.

In some embodiments, the build material comprises a polymer.

In some embodiments, the polymer is formed by ring opening polymerization.

Cured Materials

In some aspects, the present disclosure provides a cured material described herein.

In some aspects, the present disclosure provides a cured material being prepared by a method described herein.

In some embodiments, the cured material has a notched Izod impact strength of about 2.0 kJ/m$^2$ or greater, about 2.5 kJ/m$^2$ or greater, about 3.0 kJ/m$^2$ or greater, about 3.5 kJ/m$^2$ or greater, about 4.0 kJ/m$^2$ or greater, about 4.5 kJ/m$^2$ or greater, about 5.0 kJ/m$^2$ or greater, about 5.5 kJ/m$^2$ or greater, about 6.0 kJ/m$^2$ or greater, about 6.5 kJ/m$^2$ or greater, about 7.0 kJ/m$^2$ or greater, about 7.5 kJ/m$^2$ or greater, or about 8.0 kJ/m$^2$ or greater.

In some embodiments, the cured material has a notched Izod impact strength of about 15 kJ/m$^2$ or less, about 14 kJ/m$^2$ or less, about 13 kJ/m$^2$ or less, about 12 kJ/m$^2$ or less, about 11 kJ/m$^2$ or less, about 10 kJ/m$^2$ or less, about 9 kJ/m$^2$ or less, about 8 kJ/m$^2$ or less, about 7 kJ/m$^2$ or less, about 6 kJ/m$^2$ or less, about 5 kJ/m$^2$ or less, about 4 kJ/m$^2$ or less, or about 3 or less.

In some embodiments, the cured material has a heat deflection temperature (e.g., at 0.45 MPa) of about 60° C. or higher, about 65° C. or higher, about 70° C. or higher, about 75° C. or higher, about 80° C. or higher, about 85° C. or higher, about 90° C. or higher, about 95° C. or higher, about 100° C. or higher, about 110° C. or higher, about 120° C. or higher, about 130° C. or higher, about 140° C. or higher, or about 150° C. or higher.

In some embodiments, the cured material has a tensile strength of about 20 MPa or greater, about 25 MPa or greater, about 30 MPa or greater, about 35 MPa or greater, about 40 MPa or greater, about 45 MPa or greater, about 50 MPa or greater, about 55 MPa or greater, about 60 MPa or greater, 65 MPa or greater, or about 70 MPa or greater.

In some embodiments, the cured material has a tensile strength of about 150 MPa or less, about 140 MPa or less, about 130 MPa or less, about 120 MPa or less, about 110 MPa or less, about 100 MPa or less, about 90 MPa or less, about 85 MPa or less, about 80 MPa or less, about 75 MPa or less, or about 70 MPa or less.

In some embodiments, the cured material has a tensile strength of about 90±50 MPa, about 90±45 MPa, about 90±40 MPa, about 90±35 MPa, about 90±30 MPa, about 90±25 MPa, about 90±20 MPa, about 90±15 MPa, about 90±10 MPa, about 90±9 MPa, about 90±8 MPa, about 90±7 MPa, about 90±6 MPa, about 90±5 MPa, about 90±4 MPa, about 90±3 MPa, about 90±2 MPa, or about 90±1 MPa (e.g., about 90 MPa).

In some embodiments, the cured material has a tensile strength of about 70±50 MPa, about 70±45 MPa, about 70±40 MPa, about 70±35 MPa, about 70±30 MPa, about 70±25 MPa, about 70±20 MPa, about 70±15 MPa, about 70±10 MPa, about 70±9 MPa, about 70±8 MPa, about 70±7 MPa, about 70±6 MPa, about 70±5 MPa, about 70±4 MPa, about 70±3 MPa, about 70±2 MPa, or about 70±1 MPa (e.g., about 70 MPa).

In some embodiments, the cured material has a tensile strength of about 45±30 MPa, about 45±25 MPa, about 45±20 MPa, about 45±15 MPa, about 45±10 MPa, about 45±9 MPa, about 45±8 MPa, about 45±7 MPa, about 45±6 MPa, about 45±5 MPa, about 45±4 MPa, about 45±3 MPa, about 45±2 MPa, or about 45±1 MPa (e.g., about 45 MPa).

In some embodiments, the cured material has an elongation at break of about 0.1% or greater, about 0.2% or greater, about 0.3% or greater, about 0.4% or greater, about 0.5% or greater, about 0.6% or greater, about 0.7% or greater, about 0.8% or greater, about 0.9% or greater, about 1% or greater, about 1.5% or greater, about 2% or greater, about 2.5% or greater, about 3% or greater, about 3.5% or greater, about 4% or greater, about 4.5% or greater, about 5% or greater, about 6% or greater, about 7% or greater, or about 8% or greater.

In some embodiments, the cured material has an elongation at break of about 50% or less, about 45% or less, about 40% or less, about 35% or less, about 30% or less, about 25% or less, about 20% or less, about 15% or less, about 14% or less, about 13% or less, about 12% or less, about 11% or less, about 10% or less, about 9% or less, about 8% or less, about 7% or less, about 6% or less, or about 5% or less.

In some embodiments, the cured material has an elongation at break of about 10±5%, about 10±4%, about 10±3%, about 10±2%, about 10±1%, about 10±0.9%, about 10±0.8%, about 10±0.7%, about 10±0.6%, about 10±0.5%, about 10±0.4%, about 10±0.3%, about 10±0.2%, or about 10±0.1% (e.g., about 10%).

In some embodiments, the cured material has an elongation at break of about 7±5%, about 7±4%, about 7±3%, about 7±2%, about 7±1%, about 7±0.9%, about 7±0.8%, about 7±0.7%, about 7±0.6%, about 7±0.5%, about 7±0.4%, about 7±0.3%, about 7±0.2%, or about 7±0.1% (e.g., about 7%).

In some embodiments, the cured material has an elongation at break of about 5±3%, about 5±2%, about 5±1%, about 5±0.9%, about 5±0.8%, about 5±0.7%, about 5±0.6%, about 5±0.5%, about 5±0.4%, about 5±0.3%, about 5±0.2%, or about 5±0.1% (e.g., about 5%).

In some embodiments, the cured material has an elongation at break of about 3±2%, about 3±1%, about 3±0.9%, about 3±0.8%, about 3±0.7%, about 3±0.6%, about 3±0.5%, about 3±0.4%, about 3±0.3%, about 3±0.2%, or about 3±0.1% (e.g., about 3%).

In some embodiments, the cured material has an elongation at break of about 1±0.6%, about 1±0.5%, about 1±0.4%, about 1±0.3%, about 1±0.2%, or about 1±0.1% (e.g., about 1%).

In some embodiments, the cured material has a Young's modulus of about 0.1 MPa or greater, about 0.2 MPa or greater, about 0.3 MPa or greater, about 0.4 MPa or greater, about 0.5 MPa or greater, about 0.6 MPa or greater, about 0.7 MPa or greater, about 0.8 MPa or greater, about 0.9 MPa or greater, about 1.0 MPa or greater, about 1.1 MPa or greater, about 1.2 MPa or greater, about 1.3 MPa or greater, about 1.4 MPa or greater, about 1.5 MPa or greater, about 1.6 MPa or greater, about 1.7 MPa or greater, about 1.8 MPa or greater, about 1.9 MPa or greater, about 2.0 MPa or greater, about 2.1 MPa or greater, about 2.2 MPa or greater, about 2.3 MPa or greater, about 2.4 MPa or greater, about 2.5 MPa or greater, about 2.6 MPa or greater, about 2.7 MPa or greater, about 2.8 MPa or greater, about 2.9 MPa or greater, or about 3.0 MPa or greater.

In some embodiments, the cured material has a Young's modulus of about 10 MPa or less, about 9 MPa or less, about 8 MPa or less, about 7 MPa or less, about 6 MPa or less, about 5 MPa or less, about 4.5 MPa or less, about 4 MPa or less, about 3.9 MPa or less, about 3.8 MPa or less, about 3.7 MPa or less, about 3.6 MPa or less, about 3.5 MPa or less, about 3.4 MPa or less, about 3.3 MPa or less, about 3.2 MPa or less, about 3.1 MPa or less, about 3.0 MPa or less, about 2.9 MPa or less, about 2.8 MPa or less, about 2.7 MPa or less, about 2.6 MPa or less, about 2.5 MPa or less, about 2.4 MPa or less, about 2.3 MPa or less, about 2.2 MPa or less, about 2.1 MPa or less, or about 2.0 MPa or less.

In some embodiments, the cured material has a Young's modulus of about 3.2±2.0 MPa, about 3.2±1.9 MPa, about 3.2±1.8 MPa, about 3.2±1.7 MPa, about 3.2±1.6 MPa, about 3.2±1.5 MPa, about 3.2±1.4 MPa, about 3.2±1.3 MPa, about 3.2±1.2 MPa, about 3.2±1.1 MPa, about 3.2±1.0 MPa, about 3.2±0.9 MPa, about 3.2±0.8 MPa, about 3.2±0.7 MPa, about 3.2±0.6 MPa, about 3.2±0.5 MPa, about 3.2±0.4 MPa, about 3.2±0.3 MPa, about 3.2±0.2 MPa, or about 3.2±0.1 MPa (e.g., about 3.2 MPa).

In some embodiments, the cured material has a Young's modulus of about 2.5±2.0 MPa, about 2.5±1.9 MPa, about 2.5±1.8 MPa, about 2.5±1.7 MPa, about 2.5±1.6 MPa, about 2.5±1.5 MPa, about 2.5±1.4 MPa, about 2.5±1.3 MPa, about 2.5±1.2 MPa, about 2.5±1.1 MPa, about 2.5±1.0 MPa, about 2.5±0.9 MPa, about 2.5±0.8 MPa, about 2.5±0.7 MPa, about 2.5±0.6 MPa, about 2.5±0.5 MPa, about 2.5±0.4 MPa, about 2.5±0.3 MPa, about 2.5±0.2 MPa, or about 2.5±0.1 MPa (e.g., about 2.5 MPa).

In some embodiments, the cured material has a Young's modulus of about 1.8±1.5 MPa, about 1.8±1.4 MPa, about 1.8±1.3 MPa, about 1.8±1.2 MPa, about 1.8±1.1 MPa, about 1.8±1.0 MPa, about 1.8±0.9 MPa, about 1.8±0.8 MPa, about 1.8±0.7 MPa, about 1.8±0.6 MPa, about 1.8±0.5 MPa, about 1.8±0.4 MPa, about 1.8±0.3 MPa, about 1.8±0.2 MPa, or about 1.8±0.1 MPa (e.g., about 1.8 MPa).

In some embodiments, the cured material has Shore hardness of about 5 D or greater, about 6 D or greater, about 7 D or greater, about 8 D or greater, about 9 D or greater, about 10 D or greater, about 12 D or greater, about 14 D or greater, about 16 D or greater, about 18 D or greater, about 20 D or greater, about 25 D or greater, about 30 D or greater, about 35 D or greater, about 40 D or greater, about 45 D or greater, about 50 D or greater, about 55 D or greater, about 60 D or greater, 65 D or greater, or about 70 D or greater.

In some embodiments, the cured material has a Shore hardness of about 150 D or less, about 140 D or less, about 130 D or less, about 120 D or less, about 110 D or less, about 100 D or less, about 90 D or less, about 85 D or less, about 80 D or less, about 75 D or less, or about 70 D or less.

In some embodiments, the cured material has a Shore hardness of about 90±50 D, about 90±45 D, about 90±40 D, about 90±35 D, about 90±30 D, about 90±25 D, about 90±20 D, about 90±15 D, about 90±10 D, about 90±9 D, about 90±8 D, about 90±7 D, about 90±6 D, about 90±5 D, about 90±4 D, about 90±3 D, about 90±2 D, or about 90±1 D (e.g., about 90 D).

In some embodiments, the cured material has a Shore hardness of about 55±30 D, about 55±25 D, about 55±20 D, about 55±15 D, about 55±10 D, about 55±9 D, about 55±8 D, about 55±7 D, about 55±6 D, about 55±5 D, about 55±4 D, about 55±3 D, about 55±2 D, or about 55±1 D (e.g., about 55 D).

In some embodiments, the cured material has a Shore hardness of about 20±15 D, about 20±10 D, about 20±9 D, about 20±8 D, about 20±7 D, about 20±6 D, about 20±5 D, about 20±4 D, about 20±3 D, about 20±2 D, or about 20±1 D (e.g., about 20 D).

Support Materials

In some embodiments, the support material is deposited (e.g., jetted) under a support depositing condition (e.g., support jetting condition).

In some embodiments, the support material is cured under a support curing condition.

In some embodiments, the support material or the cured support material is removed under a support removal condition.

In some embodiments, the support material is a liquid under the support depositing condition (e.g., the support jetting condition).

In some embodiments, the support material is a wax.

In some embodiments, the support material has a melting point being the same or lower than the temperature of the support depositing condition.

In some embodiments, upon deposition, the support material is converted to a solid (e.g., via a phase change).

In some embodiments, upon deposition, the support material is converted to a solid by cooling.

In some embodiments, upon deposition, the support material is converted to a solid by curing.

In some embodiments, the support material is UV curable.

In some embodiments, the support material is thermally curable.

In some embodiments, the support curing condition comprises irradiation (e.g., visible light or UV).

In some embodiments, the support curing condition comprises elevated temperature.

In some embodiments, the support curing condition is substantially free of air (e.g., oxygen).

In some embodiments, the support curing condition is substantially free of water.

In some embodiments, the cured support material is substantially stable (e.g., chemically and/or physically) toward the build material.

In some embodiments, the cured support material is substantially stable (e.g., chemically and/or physically) under the build curing condition.

In some embodiments, the cured support material comprises a polymer.

In some embodiments, the support removal condition comprises adding a solvent, thereby dissolving the cured support material.

In some embodiments, the support removal condition comprises mechanically removing the cured support material.

In some embodiments, the support removal condition comprises converting the support material from a solid to a liquid (e.g., via a phase change).

Without wishing to be bound by theory, it is understood that the combination, material, or kit of the present disclosure may be useful as ink for 3D printing (e.g., jetting-based 3D printing).

In some aspects, the present disclosure provides a method of preparing a cured material, comprising a step of subjecting a combination, build material, or kit disclosed herein to a curing condition.

In some aspects, the present disclosure provides a combination, build material, or kit disclosed herein for use in preparing a cured material, wherein the preparation comprises a step of subjecting the combination, build material, or kit to a curing condition.

In some aspects, the present disclosure provides use of a combination, build material, or kit disclosed herein in the manufacture of a cured material, wherein the manufacture comprises a step of subjecting the combination, build material, or kit to a curing condition.

In some embodiments, the build curing condition comprises irradiation (e.g., visible light or UV).

In some embodiments, the build curing condition further comprises an elevated temperature.

In some embodiments, the build curing condition further comprises a chemical activation (e.g., adding water).

In some aspects, the present disclosure provides a cured material being prepared by a method described herein.

In some aspects, the present disclosure provides a method of printing an object using a combination, build material, or kit disclosed herein.

In some embodiments, the printing comprises:
(i) depositing (e.g., jetting) a build material described herein onto a supporting material; and
(ii) subjecting the deposited build material to a curing condition.

In some embodiments, the printing comprises:
(i) depositing (e.g., jetting) a first build material described herein, and a second build material described herein, onto a supporting material; and
(ii) subjecting the deposited first build material and deposited second build material to a curing condition.

In some embodiments, the printing further comprises repeating the step of depositing the material for one or more time.

In some embodiments, the printing further comprises optically sensing the deposited material, and controlling the one or more repeated deposition of the material according to the sensing.

In some embodiments, the optionally sensing of the deposited material is performed when the material is at least partially cured.

In some embodiments, each repeated deposition of the material is performed when the previously deposited layer of the material is at least partially cured.

In some embodiments, the printing further comprises depositing an agent which enhances one or more of the mechanical, thermal, and/or optical properties of the material.

In some embodiments, sensing the deposited material comprises capturing a surface of the object being printed.

In some embodiments, sensing the deposited material comprises capturing volumetric and/or tomographic data of the object being printed.

In some embodiments, the controlling one or more repeated deposition of the material comprises using an active feedback loop to modify the one or more repeated deposition of the material according to the data produced by the sensing.

In some embodiments, the controlling one or more repeated deposition of the material is based on measurements of a surface of the object being printed.

In some embodiments, the controlling one or more repeated deposition of the material is based on measurements of the volumetric/tomographic data of an object being printed.

In some embodiments, the printing further comprises heating the material, thereby facilitating the curing of the material.

Systems for Using Combinations, Materials, and Kits

In some aspects, the present disclosure provides a system for 3D printing, comprising:
(i) a printer (e.g., an inkjet printer); and
(ii) an ink comprising a combination disclosed herein.

In some embodiments, the printer (e.g., the inkjet printer) comprises one or more printer jet; an optical feedback scanner; and a controller which controls the emission of the ink from the one or more printer jet according to the optical feedback of the jetted ink.

In some embodiments, the printer (e.g., the inkjet printer) further comprises a printing head loaded (e.g., a printing head loaded with the ink).

In some embodiments, the system further comprises a light source (e.g., a UV lamp or a visible-light lamp) configured to cure the deposited layers of the ink.

In some embodiments, the system further comprises a software comprising instructions stored on a non-transitory machine-readable medium, wherein execution of said instructions causes control of one or more of the printing steps described herein.

The description below relates an exemplary system for additive fabrication, e.g., using a jetting-based 3D printer 100 shown in FIG. 1. The printer 100 uses jets 120 (inkjets) to emit material for deposition on a partially fabricated objected layers. In the printer illustrated in FIG. 1, the object is fabricated on a build platform, which is controlled to move related to the jets is a raster-like pattern to form successive layers, and in this example also to move relative to the jets to maintain a desired separation of the jets and the surface of the partially-fabricated object. As illustrated, there are multiple jets 122, 124, with one jet 122 being used to emit a support material to form a support structure 142 of the object, and another jet 124 being used to emit built material to form the object 144 itself. For materials for which curing is triggered by an excitation signal, such as an ultraviolet illumination, a curing signal generator 170 (e.g., the UV lamp 215 of FIG. 2) triggers curing of the material shortly after it is jetted onto the object. In other embodiments, multiple different materials may be used, for example, with a separate jet being used for each material. Yet other implementations do not necessarily use an excitation signal (e.g., optical, RF, etc.) and rather the curing is triggered chemically, for example, by mixing multiple components before jetting, or jetting separate components that mix and trigger curing on the object. Note that in some examples, after the additive deposition is complete, the object may be subject to further curing (e.g., to complete the curing), for example, by further exposing the object to UV radiation.

A sensor 160 is used to determine physical characteristics of the partially fabricated object, including one or more of the surface geometry (e.g., a depth map characterizing the thickness/depth of the partially fabricated object), subsurface (e.g., in the near surface comprising, for example, 10s or 100s of deposited layers) characteristics. The characteristic that may be sensed can include one or more of a material density, material identification, and a curing state. Various types of sensing can be used, including optical coherence tomography (OCT), laser profilometry, and/or as well as multi-spectral optical sensing, which may be used to distinguish different materials. In the illustrated printer, the sensor outputs a signal that may cause emission (e.g., fluorescence) and/or reflection, scattering, or absorption from or in the object. The sensor output signal may be provided from the top (i.e., the most recently deposited portion) of the object, while in some embodiments, the sensor output signal may come from below or other direction of the object.

Precision additive fabrication using inkjet technology has introduced use of optical-scanning-based feedback in order to adapt the deposition of material to achieve accurate object structure without requiring mechanical approaches that have been previously used. For example, such optical feedback techniques are described in U.S. Pat. Nos. 10,252,466 and 10,456,984 (incorporated by reference). However, optical feedback-based printers are not a prevalent commercial approach to 3D printing, perhaps due to the relative simplicity of approaches that do not achieve the precision attainable with optical feedback or that use mechanical approaches in conjunction with rapidly curing inks. Furthermore, many fabrication materials suitable for jetted additive fabrication are not directly suitable for optical scanning as inadequate optical signal strength may propagate from the material during scanning. For example, the material may be naturally substantially transparent and not reflect incident light suitably to be captured to yield an accurate characterization of the object being fabricated. However, with suitable incorporation of an optical enhancement component in the fabrication material, the ability to scan the material that has been deposited can be enhanced. Further details regarding suitable optical enhancement components may be found in PCT Appl'n No. PCT/US2019/59300 (incorporated herein by reference).

By not requiring contact to control the surface geometry of the object being manufactured, the approach is tolerant of the relative slow curing of the composition (e.g., as compared to acrylate compositions usually used in inkjet 3D printing), while maintaining the benefit of control of the deposition processes according to feedback during the fabrication processes. This approach provides a way to manufacture precision objects and benefit from material properties of the fabricated objects, for example, with isotropic properties, which may be at least partially a result of the slow curing, and flexible structures, which may not be attainable using conventional jetted acrylates. Furthermore, in cases when ongoing curing after scanning may change the geometry of the part, for example, due to shrinkage, predictive techniques (e.g., using machine-learning approaches, e.g., as described in PCT Appl'n No. PCT/US2019/59567 (incorporated herein by reference)) may be used in the control process to predict such changes, further accommodating the cationic compositions into a precision jetted fabrication approach.

A controller 110 uses a model 190 of the object to be fabricated to control motion of the build platform 130 using a motion actuator 150 (e.g., providing three degree of motion) and control the emission of material from the jets 120 according to the non-contact feedback of the object characteristics determined via the sensor 160. Use of the feedback arrangement can produce a precision object by compensating for inherent unpredictable aspects of jetting (e.g., clogging of jet orifices) and unpredictable material changes after deposition, including for example, flowing, mixing, absorption, and curing of the jetted materials.

It is understood that the printer shown in FIG. 1 is merely illustrative but not limiting. Other printer arrangements that may be used are described, e.g., in U.S. Pat. Nos. 10,252,466 and 10,456,984, U.S. Appl'n Pub. No. 2018/0056582, and Sitthi-Amorn et al. (ACM Transactions on Graphics 34 (4): 129 (2015)).

In an alternative manufacturing process, an additive fabrication stage and a subsequent or overlapping part curing stage imparts two distinct mechanisms to the build material for the part of the object: a phase change mechanism and a polymerization mechanism.

The phase change mechanism occurs during the additive fabrication stage and causes a phase change of the build material from a liquid to a non-liquid (e.g., at least partially solid, semi-solid, and/or quasi-solid), where the phase change is generally not due to polymerization. In this non-liquid form the build material is sufficiently solidified for subsequent incremental deposit of material on to it (e.g., the non-liquid build material can support the weight of incrementally added material and/or the force of the material as it is jetted to, for example, prevent mixing between the build material and the support material).

The polymerization mechanism occurs after, or at least partly after, the additive fabrication of the object during the curing stage. This mechanism cures the build material by a polymerization process. In some examples, the polymerization mechanism is initiated after additive fabrication of the object is complete. In other examples, the polymerization mechanism is initiated before additive manufacturing is complete, for example, being initiated during the phase change mechanism (e.g., with both mechanisms being initiated at the same time, or the polymerization mechanism being initiated during the phase change mechanism).

After the build material is sufficiently cured (e.g., sufficiently polymerized) in the curing stage to allow removal of the mold, the manufacturing process enters a part removal stage for removal of the mold. Removal of the mold yields the fabricated part.

Figure 2:
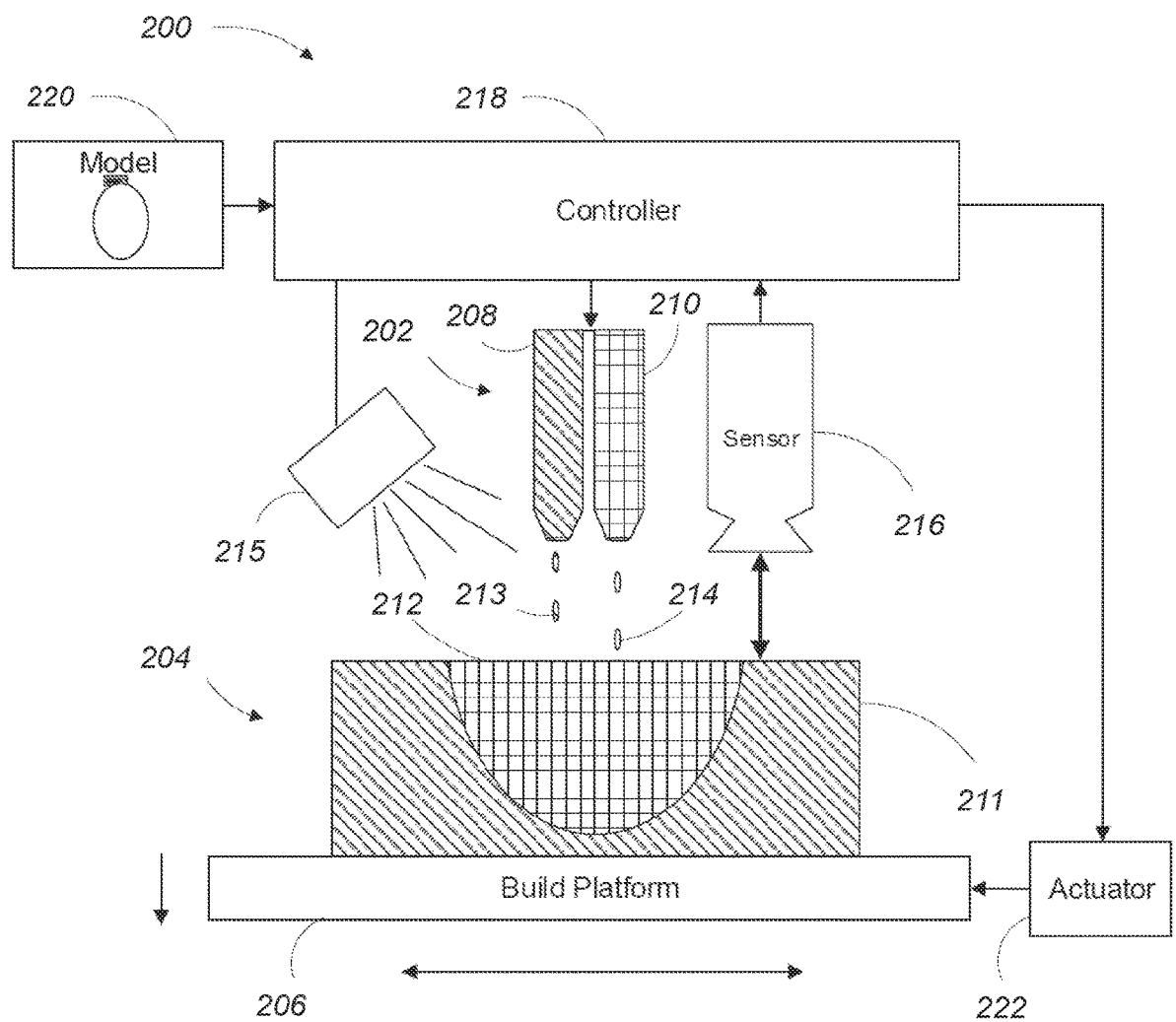
FIG. 2 is a schematic diagram of an alternative exemplary 3D printer.

Referring to FIG. 2, this alternative manufacturing process uses a jetting-based 3D printer 200 as shown in FIG. 2.

Very generally, the manufacturing process includes three temporal phases: an additive fabrication stage, a part curing stage, and a part removal stage. As is described in greater detail below, in some examples, the part curing stage occurs entirely after the additive fabrication stage. In other examples the additive fabrication stage and the part curing stage partially overlap.

In the additive fabrication stage, additive fabrication is used to fabricate an object 204 including a solid (e.g., cured) mold structure 211 that forms a cavity (e.g., closed structure or open vessel) defining a shape of the part 212, where the cavity is filled with a semi-solid, uncured or partially cured material in the shape of the part 212. The solid mold structure 211 and/or the semi-solid material are added, layer by layer, to form the object 204.

In the part curing stage, at least some of which occurs at a time after completion of the additive fabrication stage, the object 204 including the filled mold structure 211 undergoes a curing process for polymerizing the material in the cavity.

In the additive manufacturing stage and the part curing stage, the material used to form the part 212 (sometimes referred to as "build material) undergoes two distinct mechanisms: a phase change mechanism and a polymerization mechanism.

The phase change mechanism occurs during the additive fabrication stage and causes a phase change of the build material from a liquid to a non-liquid (e.g., at least partially solid, semi-solid, and/or quasi-solid, where these three terms may be used interchangeably herein). In this non-liquid form the build material is sufficiently solidified for subsequent incremental deposit of material on to it (e.g., the non-liquid build material can support the weight or force of incrementally added material).

The polymerization mechanism occurs after, or at least partly after, the additive fabrication of the object 204 during the curing stage. This mechanism cures the build material by a polymerization process. In some examples, the polymerization mechanism is initiated after additive fabrication of the object is complete. In other examples, the polymerization mechanism is initiated before additive manufacturing is complete, for example, being initiated during the phase change mechanism (e.g., with both mechanisms being initiated at the same time, or the polymerization mechanism being initiated after initiation and during the phase change mechanism).

In the part removal stage, the solid mold structure 211 is removed, yielding the part 212. In some examples, the part removal stage occurs after the part curing stage. But in other examples, the part removal stage may overlap with the part curing stage (e.g., the part 212 is still curing but is sufficiently cured for removal from the solid mold structure 211).

Printer

In the additive fabrication stage, the printer 200 uses jets 202 (inkjets) to emit material for deposition of layers to form the object 204 (shown partially fabricated in FIG. 2). For the printer illustrated in FIG. 2, the object 204 is fabricated on a build platform 206, which is controlled to move relative to the jets (i.e., along an x-y plane) in a raster-like pattern to form successive layers, and in this example also to move relative to the jets (i.e., along a z-axis) to maintain a desired separation of the jets and the surface of the partially-fabricated object 204.

As illustrated, there are multiple jets 208, 210, for example with a first jet 208 being used to emit a mold material 213 to form a solid (e.g., cured or semi-cured) mold structure 211 of the object 204, and a second jet 210 being used to emit build material 214 to form an uncured or partially cured, semi-solid (e.g., a gel or a wax) part 212 in the object 204. Additional details of the properties of the mold material 213 and the build material 214 are described below.

A sensor 216 (sometimes referred to as a scanner) is positioned relative to (e.g., above) the object under fabrication 204 and is used to determine physical characteristics of the partially fabricated object. For example, the sensor 216 measures one or more of the surface geometry (e.g., a depth map characterizing the thickness/depth of the partially fabricated object) and subsurface characteristics (e.g., in the near surface comprising, for example, 10s or 100s of deposited layers). The characteristics that may be sensed can include one or more of a material density, material identification, and a curing state. Very generally, the measurements from the sensor 216 are associated with a three-dimensional (i.e., x, y, z) coordinate system where the x and y axes are treated as spatial axes in the plane of the build surface and the z axis is a height axis (i.e., growing as the object is fabricated).

In some examples, in the context of a digital feedback loop for additive fabrication, the additive manufacturing system builds the object by printing layers. The sensor 216 captures the 3D scan information after the printer 200 prints one or more layers. For example, the sensor 216 scans the partial object (or empty build platform), then the printer prints a layer (or layers) of material(s). Then, the sensor 216 scans the (partially built) object again. The new depth sensed by the sensor 216 should be at a distance that is approximately the old depth minus the thickness of layer (this assumes that the sensor 216 is positioned on the top of the of the object being built and the object is being built from the bottom layer to the top layer and the distance between the sensor 216 and the build platform is unchanged). Various types of sensing such as optical coherence tomography (OCT) or laser profilometry can be used to determine depth and volumetric information related to the object being fabricated.

A controller 218 uses a model 220 of the object to be fabricated to control motion of the build platform 206 using a motion actuator 222 (e.g., providing three degrees of motion) and control the emission of material from the jets 202 according to non-contact feedback of the object characteristics determined via the sensor 216.

Definitions

It is understood that when the combination, material, or kit is described as "comprising an X" or "comprising at least one X", such phrase intends to refer to that the combination, material, or kit contains at least one X, but the phrase does not intend to limit the combination, material, or kit to comprise only one X. That is, in the present disclosure, the terms "comprising an X" and "comprising at least one X" are exchangeable.

As used herein, the term "ring-opening polymerization" or "ROP" refers to a form of chain-growth polymerization in which the terminus of a polymer chain repeatedly reacts with a cyclic monomer to form a longer polymer. In some embodiments, the reactive center (e.g., the terminus of the polymer chain) is anionic or cationic.

As used herein, the term "cationic ring-opening polymerization" or "cationic ROP" refers to a ring-opening polymerization in which the reactive center (e.g., the terminus of the polymer chain) is cationic.

As used herein, the term "photoinitiated ring-opening polymerization" or "photoinitiated ROP" refers to a ring-opening polymerization which is initiated upon radiation. In some embodiments, the radiation is UV ("UV-initiated"). In some embodiments, the radiation is visible light ("visible-light initiated").

As used herein, the term "photoinitiated cationic ring-opening polymerization" or "photoinitiated cationic ROP" refers to a ring-opening polymerization which is initiated upon radiation (e.g., UV or visible light) and in which the reactive center (e.g., the terminus of the polymer chain) is cationic.

As used herein, the term "polyol" refers to an organic compound (e.g., a small molecule or a polymer) containing a plurality of hydroxyl groups. In some embodiments, the polyol is a diol, a triol, or a dendritic polyol.

As used herein, the term "photoinitiator" refers to an agent that generates reactive species (e.g., cations or anions) when exposed to radiation (e.g., UV or visible light), or when exposed to an activated sensitizer.

As used herein, the term "cationic photoinitiator" refers to a photoinitiator that generates cations when exposed to radiation (e.g., UV or visible light).

As used herein, the term "sensitizer" refers to an agent (e.g., a compound) that produces a chemical change (e.g., a radial, cation, or anion) in another agent (e.g., a photoinitiator) in a photochemical process.

As used herein, the term "toughening agent" refers an agent that enhances the ability of a material (e.g., a polymeric material) to absorb energy and plastically deform without fracture. In some embodiments, upon subjecting to a condition (e.g., a curing condition), the toughening agent enhances the ability of a material (e.g., a cured material) to absorb energy and plastically deform without fracture.

As used herein, the term "pigment" refers to a colored, black, white, or fluorescent particulate organic or inorganic solid. In some embodiments, the pigment insoluble in, and essentially physically and chemically unaffected by, the vehicle or substrate in which it is incorporated. In some embodiments, the pigment alters appearance by selective absorption and/or by scattering of light. In some embodiments, the pigment is dispersed in vehicles or substrates for application, as for instance in the manufacture or inks or other polymeric materials. In some embodiments, the pigment retains a crystal or particulate structure throughout the coloration process.

As used herein, the term "dye" refers to an intensely colored or fluorescent organic substances which imparts color to a substrate by selective absorption of light. In some embodiments, the dye is soluble and/or goes through an application process which, at least temporarily, destroys any crystal structure by absorption, solution, and mechanical retention, or by ionic or covalent chemical bonds.

As used herein, the term "viscosity" refers to the ability of a composition (e.g., the material of the present disclosure) to resist deformation at a given rate.

As used herein, the term "surface tension" refers to the tendency of the surface of a composition (e.g., the material of the present disclosure) to shrink into the minimum surface area possible. In some embodiments, the surface tension is measured in the dimension of force per unit length, or of energy per unit area.

As used herein, the term "curing" refers to a process of converting a material by forming polymers and/or linking existing polymers in the material, thereby producing a cured material. In some embodiments, the conversion is initiated by radiation (e.g., UV or visible light).

As used herein, the term "notched Izod impact strength" refers to a mechanical property that measures the impact resistance of a solid material. In some embodiments, it is measured by a method in which a pivoting arm is raised to a specific height (constant potential energy) and then released. The arm swings down hitting a notched sample, breaking the specimen. The energy absorbed by the sample is calculated from the height the arm swings to after hitting the sample. A notched sample is generally used to determine impact energy and notch sensitivity. Notched Izod impact strength is associated with the energy lost per unit cross-sectional area (e.g., $kJ/m^2$) at the notch. In some embodiments, the notched Izod impact strength is measured by the ASTM D256.

As used herein, the term "heat deflection temperature" refers to the temperature at which a material deforms under a specified load. In some embodiments, the heat deflection temperature is measured by the ASTM D648.

As used herein, the term "tensile strength" refers to the maximum stress that a material can withstand while being stretched or pulled before breaking. In some embodiments, the tensile strength is measured by the ASTM D412, ASTM D624, or ASTM D638.

As used herein, the term "elongation at break" refers to the ratio between increased length and initial length after breakage of the tested specimen at a controlled temperature. In some embodiments, the elongation at break is measured by the ASTM D412, ASTM D624, or ASTM D638.

As used herein, the term "Young's modulus" refers to a mechanical property that measures the stiffness of a solid material. Young's modulus is associated with the relationship between stress (force per unit area) and strain (proportional deformation) in a material in the linear elasticity regime of a uniaxial deformation. In some embodiments, the Young's modulus is measured by the ASTM D412, ASTM D624, or ASTM D638.

As used herein, the term "Shore hardness" refers to the hardness of a material as being measured by a Shore durometer. In some embodiments, the Shore hardness is measured by a Shore durometer of type A, B, C, D, DO, E, M, O, OO, OOO, OOO-S, or R.

As used herein, the term "about" refers to a range covering any normal fluctuations appreciated by one of ordinary skill in the relevant art. In some embodiments, the term "about" refers to a range of values that fall within 25%, 20%, 19%, 18%, 17%, 16%, 15%, 14%, 13%, 12%, 11%, 10%, 9%, 8%, 7%, 6%, 5%, 4%, 3%, 2%, 1%, or less in either direction (greater than or less than) of the stated reference value unless otherwise stated or otherwise evident from the context (except where such number would exceed 100% of a possible value).

As used herein, the term "derivative" refers to compounds that have a common core structure as compared to the referenced compound and/or share one or more property with the referenced compound. In some embodiments, the derivatives are substituted with various groups as described herein as compared to the referenced compound.

As used herein, the term "substitution" refers to that any one or more hydrogen atoms on the designated atom is replaced with a selection from the indicated groups, provided that the designated atom's normal valency is not exceeded, and that the substitution results in a stable compound. When a substituent is oxo or keto (i.e., =O), then 2 hydrogen atoms on the atom are replaced. Keto substituents are not present on aromatic moieties. Ring double bonds, as used herein, are double bonds that are formed between two adjacent ring atoms (e.g., C—C, C=N or N=N). "Stable compound" and "stable structure" are meant to indicate a compound that is sufficiently robust to survive isolation to a useful degree of purity from a reaction mixture, and material into an efficacious therapeutic agent. Such substituents can include, for example, alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, amino (including alkylamino, dialkylamino, arylamino, diarylamino and alkylarylamino), acylamino (including alkylcarbonylamino, arylcarbonylamino, carbamoyl and ureido), amidino, imino, sulfhydryl, alkylthio, arylthio, thiocarboxylate, sulfates, alkylsulfinyl, sulfonato, sulfamoyl, sulfonamido, nitro, trifluoromethyl, cyano, azido, heterocyclyl, alkylaryl, or an aromatic or heteroaromatic moiety.

As used herein, the expressions "one or more of A, B, or C," "one or more A, B, or C," "one or more of A, B, and C," "one or more A, B, and C," "selected from the group consisting of A, B, and C", "selected from A, B, and C", and the like are used interchangeably and all refer to a selection from a group consisting of A, B, and/or C, i.e., one or more As, one or more Bs, one or more Cs, or any combination thereof, unless indicated otherwise.

All percentages and ratios used herein, unless otherwise indicated, are by weight. Other features and advantages of the present disclosure are apparent from the different examples. The provided examples illustrate different components and methodology useful in practicing the present disclosure. The examples do not limit the claimed disclosure. Based on the present disclosure the skilled artisan can identify and employ other components and methodology useful for practicing the present disclosure.

All publications and patent documents cited herein are incorporated herein by reference as if each such publication or document was specifically and individually indicated to be incorporated herein by reference. Citation of publications and patent documents is not intended as an admission that any is pertinent prior art, nor does it constitute any admission as to the contents or date of the same. The invention having now been described by way of written description, those of skill in the art will recognize that the invention can be practiced in a variety of embodiments and that the foregoing description and examples below are for purposes of illustration but not limitation.

EXAMPLES

Example 1. Preparation of Exemplary Materials

To assess the effect of various ingredients of the material, four exemplary materials were prepared. For each exemplary material, a base composition was prepared, followed by adding one or more ingredients to obtain the material. The details of the four exemplary materials are summarized in Tables 1A-1D below (* indicates that the amount is calculated by considering the base composition as 100%). It is understood that the values in the tables are approximate and are subject to experimental and instrumental variations.

TABLE 1A

Exemplary Material No. 1

Base Composition

| Ingredient | Amount (% w/w) |
|---|---|
| Phenyl Glycidyl Ether | 15 |
| (3-4-Epoxycyclohexane)Methyl 3'-4'-Epoxycyclohexyl-Carboxylate | 60 |
| Capa ® 3022 | 25 |

Additional Ingredients

| Ingredient | Amount (% w/w)* |
|---|---|
| Silmer ® EPC F418-F | 0.1 |
| Hypro ® 2000X168LC VTB | 1.5 |
| Irgacure ® 290 | 1 |

TABLE 1B

Exemplary Material No. 2

Base Composition

| Ingredient | Amount (% w/w) |
|---|---|
| EPALLOY ® 8220 | 27.5 |
| Limonene Dioxide | 5 |
| Epoxidized Cyclohexanedimethanol | 27.5 |
| Polypropylene Glycol 1000 | 20 |

Additional Ingredients

| Ingredient | Amount (% w/w)* |
|---|---|
| Silmer ® EPC F418-F | 0.1 |
| Irgacure ® 290 | 1 |

TABLE 1C

Exemplary Material No. 3

Base Composition

| Ingredient | Amount (% w/w) |
|---|---|
| (3-4-Epoxycyclohexane)Methyl 3'-4'-Epoxycyclohexyl-Carboxylate | 30 |
| O-Cresyl Glycidyl Ether. | 20 |
| Boltorn ™ H2004 | 10 |
| 1,4-Bis[(3-Ethyl-3-Oxetanylmethoxy)Methyl]Benzene | 20 |
| Trixene ® BI 7771 | 20 |

Additional Ingredients

| Ingredient | Amount (% w/w)* |
|---|---|
| Silmer ® EPC F418-F | 0.05 |
| Irgacure ® 290 | 1 |

TABLE 1C

Exemplary Material No. 4

Base Composition

| Ingredient | Amount (% w/w) |
|---|---|
| EPALLOY ® 9000 | 10 |
| (3-4-Epoxycyclohexane)Methyl 3'-4'-Epoxycyclohexyl-Carboxylate | 50 |
| Polypropylene Glycol 425 | 20 |
| 3-Ethyloxetane-3-Methanol | 20 |

Additional Ingredients

| Ingredient | Amount (% w/w)* |
|---|---|
| Silmer ® EPC F418-F | 0.05 |
| Irgacure ® 290 | 1 |

Example 2. Preparation of Additional Exemplary Materials

To assess the effect of various ingredients of the material, several exemplary materials were prepared and characterized. The details of the exemplary materials are summarized in Table 2. It is understood that the values in the table are approximate and are subject to experimental and instrumental variations.

TABLE 2

| Exemplary Material No. | | M1 | M2 | M3 | M4 | M5 | M6 | M7 | M8 |
|---|---|---|---|---|---|---|---|---|---|
| Composition | | | | | | | | | |
| Ring-Containing Agent | ERISYS ® GE-13 | | | | | | | | 10 |
| | UviCure S105 | 50 | 40 | 49 | 5 | 20 | | | |
| | EPALLOY ® 8220 | 15 | 20 | 15 | | | | | |
| Polyol | Polycaprolactone Diol (MW = 530) | | 20 | | | | | | |
| | Capa ® 2043 | | | | | | 12.5 | 10 | |
| | Capa ® 3031 | 20 | 20 | 10 | 15 | 20 | | | |
| | Capromer ™ PD4-05 | | | 16 | | | | | |
| | Polytetrahydrofuran Diol (Mn = 250) | 15 | | | | | | | |
| Toughening Agent | Curalite ™ Ox | 20 | 20 | 20 | | | | | |
| | Curalite ™ OxPlus # | | | | 5 | 5 | 7.5 | 5 | 5 |
| | Kane Ace ® MX-553* | | | | 70 | 55 | 70 | 70 | 65 |
| Surface Tension Modifier | Silmer ® EPC F418-F | 0.05 | | 0.05 | | | | | |
| Curing Catalyst | SpeedCure 992 | 2 | 2 | 2 | 2 | 2 | 2 | 2 | 2 |
| Sensitizer | ANTHRACURE ® UVS 1101 | 0.27 | 0.27 | 0.27 | 0.27 | 0.27 | 0.27 | 0.27 | 0.27 |
| Properties | | | | | | | | | |
| Viscosity at 70° C. (cP) | | 13.7 | 17 | 16 | 113.2 | 71.4 | 99.4 | 107.4 | 68.96 |
| Notched Izod Impact Strength (kJ/m$^2$) | | 4.84 | 5.26 | 3.26 | 7.09 | 6.11 | 7.96 | 7.97 | 5.78 |
| Heat Deflection Temperature (° C.) at 0.45 MPa | | 77.7 | 75.1 | | 112.5 | 113 | 85.5 | 78.3 | 81.6 |

*It is understood that while Kane Ace ® MX-553 is listed under the category of toughening agent, Kane Ace ® MX-553 also includes the ring containing agent (e.g., 7-oxabicyclo[4.1.0]hept-3-ylmethyl).

EQUIVALENTS

The details of one or more embodiments of the disclosure are set forth in the accompanying description above. Although any methods and materials similar or equivalent to those described herein can be used in the practice or testing of the present disclosure, the preferred methods and materials are now described. Other features, objects, and advantages of the disclosure will be apparent from the description and from the claims. In the specification and the appended claims, the singular forms include plural referents unless the context clearly dictates otherwise. Unless defined otherwise, all technical and scientific terms used herein have the same meaning as commonly understood by one of ordinary skill in the art to which this disclosure belongs. All patents and publications cited in this specification are incorporated by reference.

The foregoing description has been presented only for the purposes of illustration and is not intended to limit the disclosure to the precise form disclosed.

What is claimed is:

1. A combination comprising:
   (i) a ring-containing agent comprising an oxirane agent and an oxetane agent;
   (ii) a polyol comprising a polytetrahydrofuran diol;
   (iii) a sulfonium curing catalyst;
   (iv) a stabilizer comprising a sulfide compound; and
   (v) a sensitizer comprising 9,10-diethoxyanthracene, 9,10-dibutoxyanthracene, or a combination thereof;
   wherein:
   the sensitizer is present at a concentration of up to 0.5% w/w; and
   the combination is configured to be suitable for inkjet 3D printing with a viscosity of about 100 cp or less as measured at a temperature of about 70° C.

2. The combination of claim 1, further comprising a toughening agent, a surface tension modifier, a colorant, or any combination thereof.

3. The combination of claim 1, wherein the combination is configured to be suitable for inkjet 3D printing with a viscosity of about 30 cp or less as measured at a temperature of about 70° C.

4. The combination of claim 1, wherein the combination is configured to be suitable for inkjet 3D printing with a viscosity of about 20 cp or less as measured at a temperature of about 70° C.

5. The combination of claim 1, wherein the oxirane agent or the oxetane agent comprises a bisphenol moiety.

6. The combination of claim 1, wherein the polyol has a number average molecular weight (Mn) of 250±100.

7. The combination of claim 6, wherein the polyol has a number average molecular weight (Mn) of 250±50.

8. The combination of claim 1, wherein the sulfonium curing catalyst comprises (sulfanediyldibenzene-4,1-diyl)bis(diphenylsulfonium) bis(hexafluoroantimonate), (4-{[4-(diphenylsulfanylium)phenyl]-sulfanyl}phenyl)diphenylsulfonium bishexafluorophosphate, or any combination thereof.

9. The combination of claim 1, wherein the sensitizer comprises 9,10-diethoxyanthracene present at a concentration of up to about 0.5% w/w.

10. The combination of claim 1, further comprising a surface tension modifier, wherein the surface tension modifier is also a ring-containing agent.

11. The combination of claim 1, further comprising a toughening agent, wherein the toughening agent comprises core-shell particles.

12. The combination of claim 11, wherein the toughening agent further comprises a ring-containing agent.

13. The combination of claim 1, wherein the oxetane agent comprises 3-ethyloxetane-3-methanol.

14. The combination of claim 1, wherein the oxirane agent comprises (3-4-epoxycyclohexane)methyl 3'-4'-epoxycyclohexyl-carboxylate.

15. The combination of claim 1, wherein the sulfide compound is a dialkyl sulfide.

16. The combination of claim 1, wherein the polyol is present at a concentration of 15% w/w or less.

17. The combination of claim 1, wherein the sulfonium curing catalyst is present at a concentration of 2±0.2% w/w.

18. The combination of claim 1, wherein the sulfonium curing catalyst is present at a concentration of about 2% w/w.

19. The combination of claim 1, further comprising a toughening agent, wherein the toughening agent is present at a concentration of about 30% w/w or more.

20. A build material or a kit, comprising the combination of claim 1.

21. A method of preparing a cured material, comprising a step of subjecting the combination of claim 1 to a curing condition.

22. A cured material being prepared by the method of claim 21.

23. A method of printing an object, comprising:
(i) depositing the combination of claim 1; and
(ii) subjecting the deposited combination to a curing condition.

24. A combination comprising:
a ring-containing agent comprising:
(3-4-epoxycyclohexane)methyl 3'-4'-epoxycyclohexyl-carboxylate present at a concentration of 45±15% w/w;
3-ethyloxetane-3-methanol present at a concentration of 15±5% w/w; and
an oxirane agent comprising a bisphenol moiety or an oxetane agent comprising a bisphenol moiety;
a dialkyl sulfide present at a concentration of about 0.2% w/w;
a polytetrahydrofuran diol present at a concentration of about 20±10% w/w;
9,10-diethoxyanthracene present at a concentration of up to about 0.2% w/w; and
(sulfanediyldibenzene-4,1-diyl)bis(diphenylsulfonium) bis(hexafluoroantimonate) present at a concentration of 2±0.2% w/w;
wherein the combination is configured to be suitable for inkjet 3D printing with a viscosity of about 100 cp or less as measured at a temperature of about 70° C.

25. The combination of claim 24, wherein each component of the combination is configured to be suitable for inkjet 3D printing with a viscosity of about 30 cp or less as measured at a temperature of about 70° C.

26. The combination of claim 24, wherein each component of the combination is configured to be suitable for inkjet 3D printing with a viscosity of about 20 cp or less as measured at a temperature of about 70° C.

27. The combination of claim 24, wherein (3-4-epoxycyclohexane)methyl 3'-4'-epoxycyclohexyl-carboxylate is present at a concentration of 45±10% w/w.

28. A build material or a kit, comprising the combination of claim 24.

29. A method of preparing a cured material, comprising a step of subjecting the combination of claim 24 to a curing condition.

30. A cured material being prepared by the method of claim 29.

31. A method of printing an object, comprising:
(i) depositing the combination of claim 24; and
(ii) subjecting the deposited combination to a curing condition.

* * * * *